United States Patent
Cocca

(10) Patent No.: US 10,347,872 B2
(45) Date of Patent: *Jul. 9, 2019

(54) SYSTEMS, DEVICES AND METHODS FOR THE QUALITY ASSESSMENT OF OLED STACK FILMS

(71) Applicant: Kateeva, Inc., Newark, CA (US)

(72) Inventor: Christopher Cocca, Fremont, CA (US)

(73) Assignee: Kateeva, Inc., Newark, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/709,320

(22) Filed: Sep. 19, 2017

(65) Prior Publication Data

US 2018/0366687 A1    Dec. 20, 2018

Related U.S. Application Data

(63) Continuation of application No. 15/250,283, filed on Aug. 29, 2016, now Pat. No. 9,812,672, which is a
(Continued)

(51) Int. Cl.
  *G06T 7/00* (2017.01)
  *H01L 51/00* (2006.01)
  *H01L 51/56* (2006.01)

(52) U.S. Cl.
  CPC .............. *H01L 51/56* (2013.01); *G06T 7/001* (2013.01); *G06T 7/0004* (2013.01);
  (Continued)

(58) Field of Classification Search
  CPC .................................................. G06T 7/0004
  See application file for complete search history.

(56) References Cited

U.S. PATENT DOCUMENTS

| 5,764,209 A | 6/1998 | Hawthorne et al. |
| 6,916,221 B2 | 7/2005 | Kaltenbach et al. |

(Continued)

FOREIGN PATENT DOCUMENTS

| CN | 1903573 A | 1/2007 |
| CN | 102640489 B | 12/2014 |

(Continued)

OTHER PUBLICATIONS

Applicant Initiated Interview Summary dated Mar. 31, 2016, to U.S. Appl. No. 14/180,015.
(Continued)

*Primary Examiner* — Kim Y Vu
*Assistant Examiner* — Molly Delaney
(74) *Attorney, Agent, or Firm* — Paula J. Tostado

(57) ABSTRACT

This disclosure provides techniques for assessing quality of a deposited film layer of an organic light emitting diode ("OLED") device. An image is captured and filtered to identify a deposited layer that is to be analyzed. Image data representing this layer can be optionally converted to brightness (grayscale) data. A gradient function is then applied to emphasize discontinuities in the deposited layer. Discontinuities are then compared to one or more thresholds and used to ascertain quality of the deposited layer, with optional remedial measures then being applied. The disclosed techniques can be applied in situ, to quickly identify potential defects such as delamination before ensuing manufacturing steps are applied. In optional embodiments, remedial measures can be taken dependent on whether defects are determined to exist.

21 Claims, 19 Drawing Sheets

Related U.S. Application Data continuation of application No. 14/180,015, filed on Feb. 13, 2014, now Pat. No. 9,443,299.

(60) Provisional application No. 61/766,064, filed on Feb. 18, 2013.

(52) U.S. Cl.
CPC ........ *G06T 7/0008* (2013.01); *H01L 51/0004* (2013.01); *H01L 51/0031* (2013.01); *G06T 2207/10024* (2013.01); *G06T 2207/20072* (2013.01); *G06T 2207/30121* (2013.01)

(56) References Cited

U.S. PATENT DOCUMENTS

| | | | | |
|---|---|---|---|---|
| 7,148,719 | B2* | 12/2006 | Lee | G01R 31/2635 324/754.23 |
| 7,289,154 | B2* | 10/2007 | Gindele | G06T 5/008 348/222.1 |
| 7,714,996 | B2 | 5/2010 | Yan et al. | |
| 8,035,812 | B2 | 10/2011 | Shah | |
| 9,443,299 | B2 | 9/2016 | Cocca | |
| 2002/0088952 | A1* | 7/2002 | Rao | G01N 21/9501 250/559.45 |
| 2004/0097160 | A1* | 5/2004 | Kaltenbach | H01L 51/56 445/3 |
| 2004/0207836 | A1* | 10/2004 | Chhibber | G01N 21/4738 356/237.4 |
| 2004/0213449 | A1* | 10/2004 | Safaee-Rad | G06T 7/0004 382/141 |
| 2006/0115142 | A1* | 6/2006 | Sim | G06T 7/001 382/145 |
| 2007/0024664 | A1 | 2/2007 | Shang et al. | |
| 2007/0071304 | A1* | 3/2007 | Kuchii | G06T 7/0004 382/141 |
| 2008/0247630 | A1* | 10/2008 | Horiuchi | G01N 21/9501 382/141 |
| 2008/0278598 | A1* | 11/2008 | Greenberg | G06T 1/20 348/222.1 |
| 2008/0292176 | A1* | 11/2008 | Sakai | G06T 7/001 382/144 |
| 2011/0090371 | A1 | 4/2011 | Cote et al. | |
| 2012/0019835 | A1* | 1/2012 | Nakao | G01N 21/8806 356/600 |
| 2012/0062642 | A1 | 3/2012 | Jimenez et al. | |
| 2013/0202188 | A1* | 8/2013 | Urano | G06K 9/6202 382/149 |
| 2013/0329098 | A1 | 12/2013 | Lim et al. | |
| 2017/0077461 | A1 | 3/2017 | Cocca | |

FOREIGN PATENT DOCUMENTS

| | | |
|---|---|---|
| CN | 105900418 A | 8/2016 |
| JP | 2004279239 A | 10/2004 |
| JP | 2005181040 A | 7/2005 |
| JP | 2006145484 A * | 6/2006 |
| JP | 2006145484 A | 6/2006 |
| JP | 2007065561 A | 3/2007 |
| JP | 2007066561 A | 3/2007 |
| JP | 2010159979 A | 7/2010 |
| TW | 201300198 A | 1/2013 |
| WO | 2006078916 A2 | 7/2006 |
| WO | 2009044519 A1 | 4/2009 |

OTHER PUBLICATIONS

Examination Report dated Mar. 13, 2017, to TW Patent Application No. 103105246.
Extended European Search Report dated Sep. 30, 2016 for EP Application No. 14751566.2.
Final Office Action dated Dec. 4, 2015, to U.S. Appl. No. 14/180,015.
International Search Report and Written Opinion dated May 20, 2014 to PCT Application No. PCT/US2014/16255.
Lee, Sang-Ho, Hwang, Jun Young, Kang, Kyungtae, Kang, Heuiseok. "Fabricating of Organic Light Emitting Display using Inkjet Printing Technology" IEEE 2009.
Non-Final Office Action dated Apr. 19, 2017, to U.S. Appl. No. 15/250,281.
Non-Final Office Action dated May 8, 2015, to U.S. Appl. No. 14/180,015.
Notice of Allowance dated Jul. 18, 2016, to U.S. Appl. No. 14/180,015.
Notice of Allowance dated Sep. 7, 2017, to U.S. Appl. No. 15/250,283.
Observation filed on May 8, 2017 as a response to the Office action dated Mar. 7, 2017, to CN Patent Application No. 20148009276.4.
Office action dated Jun. 26, 2017, to JP Patent Application No. 2015-558128.
Office Action dated Mar. 7, 2017, to CN Patent Application No. 201480009276.4.
Response filed on Apr. 25, 2017, to the Examination Report dated Oct. 18, 2016, to EP Patent Application No. 14751566.2.
KR First Refusal dated Jul. 30, 2018, to KR Patent Application No. 10-2015-7025541.
Provisional Rejection dated Jan. 6, 2018, to KR Patent Application No. 10-2015-7025541.
Notice of Final Refusal dated Nov. 15, 2018, to KR Patent Application No. 10-2015-7025541.
Office action dated Jan. 7, 2019 to JP Patent Application No. 2017-253296.

* cited by examiner

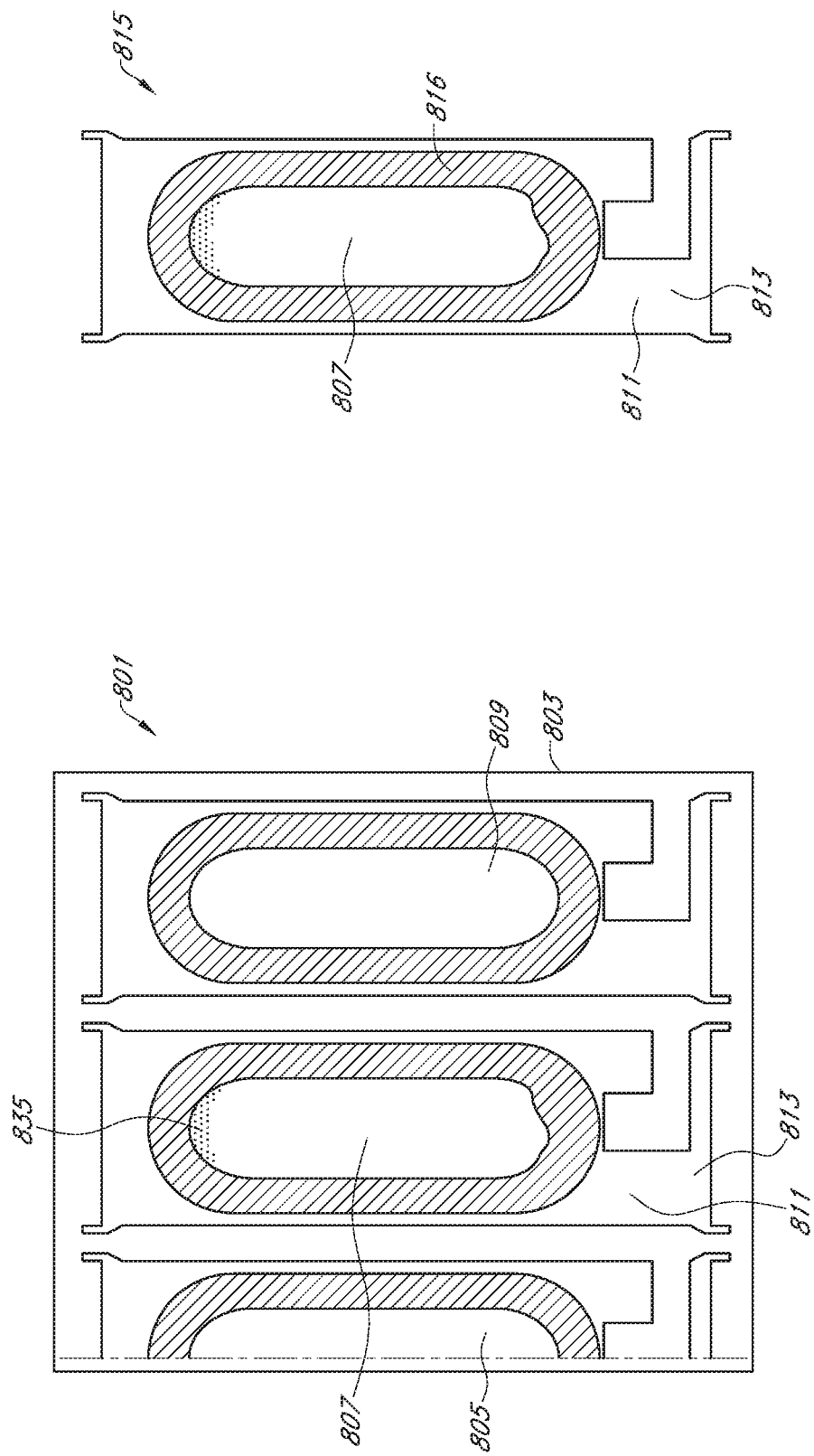

SYSTEMS, DEVICES AND METHODS FOR THE QUALITY ASSESSMENT OF OLED STACK FILMS

This application is a continuation application of U.S. Utility application Ser. No. 15/250,283, filed on Aug. 29, 2016. U.S. Utility application Ser. No. 15/250,283 in turn is a continuation of U.S. application Ser. No. 14/180,015, filed on Feb. 13, 2014 (issued on Sep. 13, 2016 as U.S. Pat. No. 9,443,299). U.S. Utility application Ser. No. 14/180,015 claims benefit of U.S. Provisional Patent Application No. 61/766,064, filed on Feb. 18, 2013. All applications named in this section are hereby incorporated by reference.

FIELD

The present teachings are related to systems, devices and methods useful for quality assessment of various films formed in pixel well structures during the manufacture of an organic light emitting diode ("OLED") device.

BACKGROUND

Interest in the potential of OLED device technology has been driven in large part by the demonstration of flat panels that have highly-saturated colors and have high contrast, and that are ultrathin and energy efficient. Additionally, a wide variety of substrate materials, including flexible polymeric materials, can be used in the fabrication of OLED devices. An OLED device can be manufactured by the printing of various organic and other thin films onto a substrate using an industrial printing system. Nearly any desired size of substrate can be used in such a process, from substrates sized for use as cell phone displays to substrates sized for use as very large television ("TV") screens. To provide two non-limiting example, ink jet printing of thin films can be used for Gen 7.5 substrates, having dimensions of about 195 cm×225 cm, with these substrates then being cut into eight 42" or six 47" flat panels per substrate, and for Gen 8.5 substrates, having dimensions of about 220×250 cm, with these substrates then being cut into six 55" or eight 46" flat panels per substrate.

OLED devices typically have a number of pixels that make up a display. In a color display, each pixel typically has three separate color generating elements. Each of these elements, in turn, typically uses a "well" to receive one or more thin film layers during an ink jet printing process. Thus, each pixel of the OLED device is typically associated with three wells corresponding to respective pixel colors. The assemblage of layers for each color component (i.e., associated with each well) forms an "OLED stack." Each OLED stack can include 6-7 film layers. During manufacture, it is desired to uniformly deposit each of these layers.

For perspective, a high-definition flat panel display can contain over 2 million pixels with a pixel density of between about 300 ppi to about 450 ppi. Clearly, given the sheer number of functioning pixels that must be formed on a substrate during manufacture of various OLED devices, a high degree of manufacturing accuracy is required. In the process of forming the various layers, various discontinuities between or within film layers can occur, which can result in a pixel that does not perform as designed or is otherwise identified as defective.

Accordingly, there is a need in the art for systems, devices and methods that can be used to timely and systematically assess quality of thin films formed on a substrate during the manufacture of an OLED device.

BRIEF DESCRIPTION OF THE DRAWINGS

Illustrative embodiments of the invention will hereafter be described with reference to the accompanying drawings.

FIG. 8A through FIG. 8F depict schematic representations of a one or more pixels wells, used to illustrate operation of an image processing application in accordance with various embodiments of the present teachings.

DETAILED DESCRIPTION

Figure 1A:
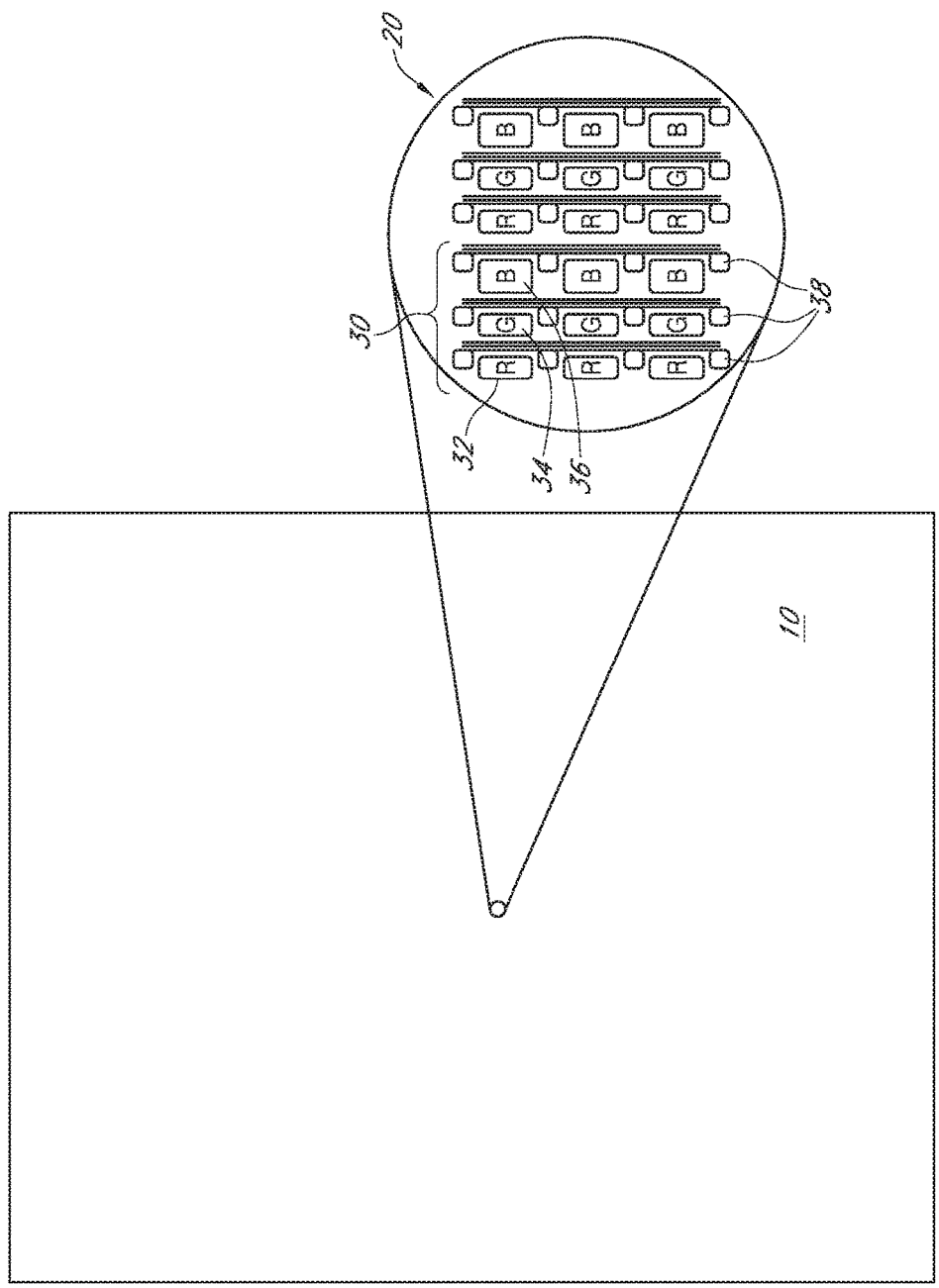
FIG. 1A is a schematic representation of an exemplary pixel arrangement within a display panel in accordance with the present teachings.

This disclosure provides systems, devices and methods for the evaluation of quality of a thin film layer deposited during OLED device fabrication. One or more layers of an OLED stack can be successively printed onto target areas of a substrate; each target area is optionally a pixel well that will be associated with a specific color component of a pixel of light to be generated by the finished OLED device. An inkjet printing process is optionally used for this printing process. Deposited layers can be formed of either organic or inorganic materials, but typically, the OLED stack includes at least one organic layer formed using this process (e.g., optionally an emissive material layer or "EML"). After printing a specific ink into targeted areas, one or more post-printing processing steps can be performed in order to finish each layer, for example, by converting deposited fluid into a permanent structure. In order to assess the quality of each layer formed in each target area, images of all target areas are captured during or following layer deposition and/or formation, for example, using a high-speed, high-resolution camera. Such imaging can optionally be performed prior to the deposition of an ensuing layer of the OLED stack, in order to assess quality of a previous 'wet' layer or finished layer (i.e., at any stage of the layer formation process).

Non-uniformity in a deposited layer can be detected through the evaluation of image data taken as a result of this image capture. Each captured image is typically a high-resolution close-up view of one or more pixel wells or one or more pixels of an OLED device substrate. Non-uniformity can be expressed as a discontinuity between film layers within a pixel well, for example, which indicates a delamination between films, gaps, pinholes or other types of issues. Each captured image can encompass, by way of non-limiting example, one or more pixel wells, area surrounding the one or more pixel wells, a bank that defines confines of each pixel well, and a film deposited within each pixel well to form part of an OLED stack. A captured image can be filtered to isolate generate filtered data to isolate image data corresponding to just the deposited layer of interest film, and to remove superfluous data (such as image data for areas outside of a given pixel well or wells). This filtered data is typically image data just of the film layer in question. A gradient function can be applied to this filtered data to form processed data. The processed data is typically an image of gradient values that highlights discontinuities from uniform image data. For various embodiments of systems and methods of the present teachings, such processed data can be used to evaluate the quality of an OLED stack film in one or more wells, for example, dependent on the magnitude of discontinuities, the number of discontinuities, or one or more other criteria. A result or output can then be generated representing the quality of a pixel well that has been evaluated using the processed image data. In various embodiments of the present teachings, this output can represent whether or not a deposited layer within a particular pixel well has a fill issue or a delamination issue. In another embodiment, the described process can be iteratively applied for each layer in an OLED stack within a pixel well, with a result indicating an unacceptable error and consequently being used to dictate subsequent processing. Finally, remedial measures can then optionally be taken if any defects are identified. As should be apparent, no manufacturing process is perfect, and the timely detection of defects and use of such remedial measures is important to maximizing quality and production speed and minimizing cost.

In one embodiment, the filtered data (i.e., image data representing just the deposited layer under analysis) can be converted (prior to application of the gradient function) to a specific format that helps emphasize a specific image characteristic, such as brightness, gray scale value, hue, color intensity, or another image characteristic. In one embodiment, for example, filtered data representing a color image is converted to 8-bit grayscale intensity values, one for each pixel or "PEL" of the filtered data ("PEL will typically be used in referring to pixels of high-resolution captured data from the camera, whereas "pixel" will typically be used in referring to picture elements of a finished OLED panel and associated light generating components and/or the areas occupied by these components). This emphasized data (e.g., monochromatic image data in the case of grayscale conversion) is then subjected to the gradient function to produce the processed data. The gradient function accentuates non-uniformity on a localized basis within a pixel well under scrutiny, as mentioned.

One embodiment of the present teachings provides a computer-readable medium having stored thereon computer-readable instructions. When executed, these computer-readable instructions cause a processor to process captured imaged data representing a target area to analyze quality of a deposited film. Once again, the target area can include at least one pixel well represented by a captured image. The computer-readable medium is a non-transitory medium, meaning that it is a physical structure adapted to store data in electronic, magnetic, optical or other form. Examples of such a medium include, for example, a flash drive, floppy disk, tape, server storage or mass storage, hard drive, dynamic random access memory (DRAM), compact disk (CD) or other local or remote storage. The computer-readable medium can have instructions stored thereon that when executed by the processor can cause a system to perform various embodiments of a method for identifying discontinuities in a filmed formed on an OLED device substrate. The computer-readable medium can be optionally embodied as part of a larger machine or system (e.g., resident memory in a desktop computer or printer) or it can exist on an isolated basis (e.g., flash drive or standalone storage that will later transfer a file to another computer or printer). The larger machine or system can optionally include a camera and a processor and, optionally, a printing device including a printhead and/or camera conveyance mechanism. The camera can be mounted on an assembly that includes a light source for illuminating a target area of an OLED device substrate during image capture, i.e., to take a picture of an inactive OLED device substrate during fabrication, using illumination external to that substrate.

In still more detailed embodiments, the gradient function is applied by a mathematical process against image data representing a specific target area, as a convolution between elements from two matrices. This image data can be the filtered data referred to above, and typically includes image data derived from PELS of the captured image. This image data as mentioned can emphasize a specific image characteristic, such as color intensity, brightness, and so forth. The convolution can optionally be performed by software or firmware, that is, by one or more machines acting under the control of software and/or firmware. The result of the convolution can be expressed as a matrix of gradient values corresponding to a film layer under scrutiny. A measure is then applied (i.e., one or more criteria or thresholds) to assess quality of the deposited film. If the result meets the applied measure(s), the deposited layer is determined to have satisfactory quality, and otherwise is determined to present a possible issue. As a non-limiting example of an action that can be taken in response to identification of an issue, the display panel can be rejected without further processing (potentially saving manufacturing time and expense) or subjected to further processing in an effort to remedy the issue. Note that a wide variety of different criteria can be applied to assess quality; for example, in one specific detailed embodiment discussed below, the absolute values of gradient values for a layer within a pixel well are summed together (or the squares of the gradient values are summed together), and the deposited film is determined to be acceptable if the resultant sum is less than a threshold. In another embodiment, a second test can instead be applied to distinguish a large noticeable discontinuity or gradient (e.g., a significant problem) from a number of small discontinuities (e.g., which might represent no problem); in this regard a statistical test can also be applied (e.g., comparison of a standard deviation of values from the result matrix with a second threshold) to identify any particular characteristic that might represent an issue. For example, in one application discussed below, a histogram is computed for the gradient values associated with each pixel well containing the layer under scrutiny; a high incidence of intense gradients might indicate a "racetrack" effect associated with delamination within a given pixel well. These tests may also be used in combination with one another if desired, for example, to deem a layer within a given well as of acceptable quality only if both tests are satisfied. Clearly, many alternate tests and combinations of tests also exist and can be selected for various embodiments.

In still another embodiment, a second gradient function can optionally be applied. For example, the filtering process discussed above can also use a gradient function to identify contours of the deposited layer from the captured image, with these contours then being used to mask out portions of the captured image not directly representing the deposited layer under consideration. In a more specific implementation, a copy of each captured image is filtered using such a gradient function to locate "banks" that structurally define contours of each pixel well. A mask function is then defined based on this analysis to pass (i.e., not mask) image data within the banks (for example, that might correspond to the deposited layer of interest) and to block (i.e., mask out) image data corresponding to substrate structures outside of the confines of the pixel well at issue (i.e., lying outside of the banks). This mask is then applied to the original image data in order to obtain the filtered data (i.e., representing just the layer under scrutiny).

As should be apparent from the foregoing, the various operations discussed above, and methods, devices and systems that perform those operations, facilitate timely and systematic evaluation of the quality of films of an OLED device. These various methods, devices and systems therefore lead to more reliable OLED devices, because potential defects can be more accurately detected; they also lead to reduced manufacturing costs, because such defects can be detected (and potentially cured) without the expense and time associated with further processing on a potentially defective OLED device, or expense and time associated with a discard of salvageable materials.

Additional details and options will be evident to those skilled in the art from the discussion below.

FIG. 1A is a schematic top view of an OLED device substrate 10, with an expanded view 20 showing circuitry for six pixels formed on the surface of substrate 10. A single pixel is designated by numeral 30, and is seen to consist of separate red, green and blue light generating elements (32, 34 and 36). Additional circuitry (such as depicted by numeral 38) can be formed on the OLED device display substrate to assist with control over generation of light by a respective pixel well.

Figure 1B:
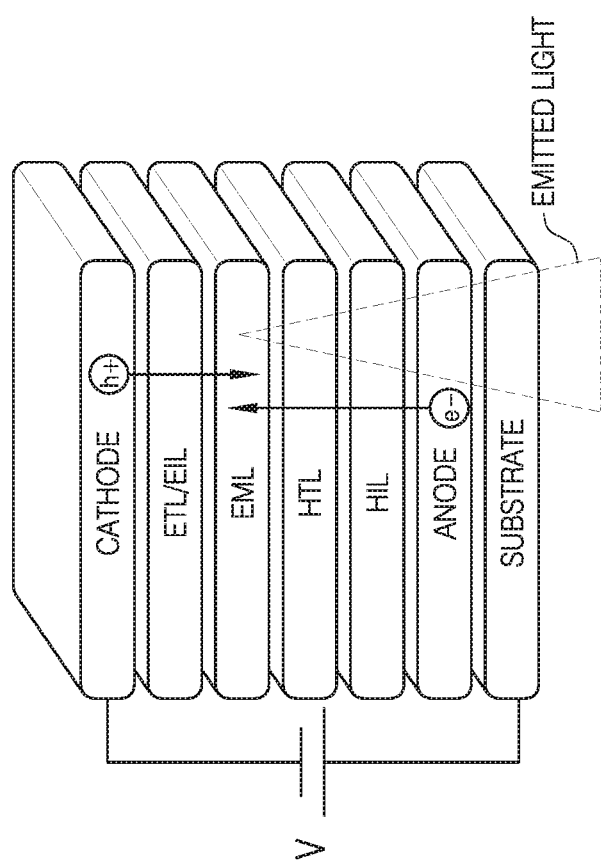
FIG. 1B is a schematic depiction of an embodiment of an OLED stack in accordance with the present teachings.

As previously mentioned, during the manufacture of an OLED flat panel display, an OLED pixel is formed to include at least one OLED film stack, which can emit light when a voltage is applied. FIG. 1B depicts an embodiment of an OLED stack film structure that includes between the anode and the cathode a hole injection layer (HIL), a hole transport layer (HTL), an emissive layer (EML), and an electron transport layer (ETL) combined with an electron injection layer (EIL). When voltage is applied across the anode and cathode, light of a specific wavelength is emitted from the EML layer, as indicated in FIG. 1B. In various embodiments of systems, devices and methods of the present teachings, the HIL, HTL, EML, and ETL/EIL layers depicted in FIG. 1B can be printed using inkjet printing. Each of the HIL, HTL, and ETL.EIL OLED stack layers has an ink formulation including materials that define the function of those OLED stack film layers. As will be discussed in more detail subsequently, a pixel can include three color generating elements, where each element has an EML layer that emits a different wavelength of light, for example, but not limited by, red, green and blue. For various embodiments of an OLED pixel cell of the present teachings, each EML layer has an ink formulation including an OLED material that can emit in the targeted electromagnetic wavelength range. Note that it is possible to have a monochromatic display (e.g., with a single pixel well for each pixel), as well as any number or combination of color components and associated pixel wells.

Figure 2A:
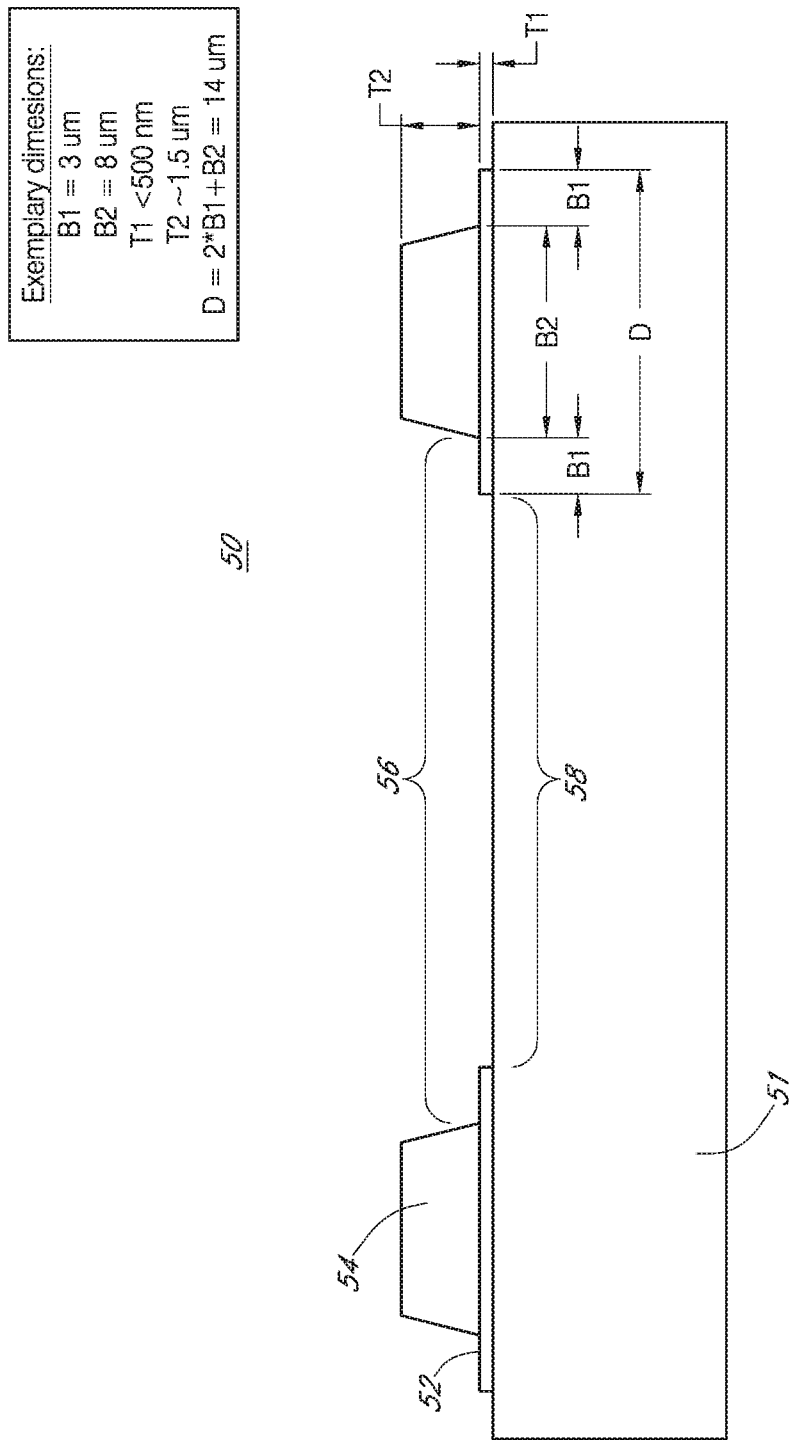
FIG. 2A is a section view that depicts an illustrative pixel well in accordance with the present teachings.

FIG. 2A shows a cross-section of a pixel well 50, into which inks for forming various OLED stack layers can be printed to define a single color generating element. While the cross-section depicts a pair of double bank structures (designated by numerals 52 and 54) that serve to confine deposited fluids, in fact the these structures typically form part of a single, closed shape (e.g., such as represented by the contours of red, green or blue light generation areas, respectively, numerals 62, 64 and 66 of FIG. 2B). In the case of pixel well 50, the substrate 51 is typically a transparent structure and, consequently, region 58 represents an area of active pixels width that will be associated with (unimpeded) generated light, whereas area 56 represents a well width associated with deposited layers. Relative heights and distances of the various structures are identified by a legend seen at the upper-right-hand side of FIG. 2A. As referenced earlier, in some embodiments, the pixel bank, more specifically confinement bank 54, is detected and used to filter the captured image data that is used for analyzing a deposited layer, such that only this filtered image data corresponding to the pixel well width (56) is processed to assess layer discontinuities. This is not required for all embodiments.

Figure 2B:
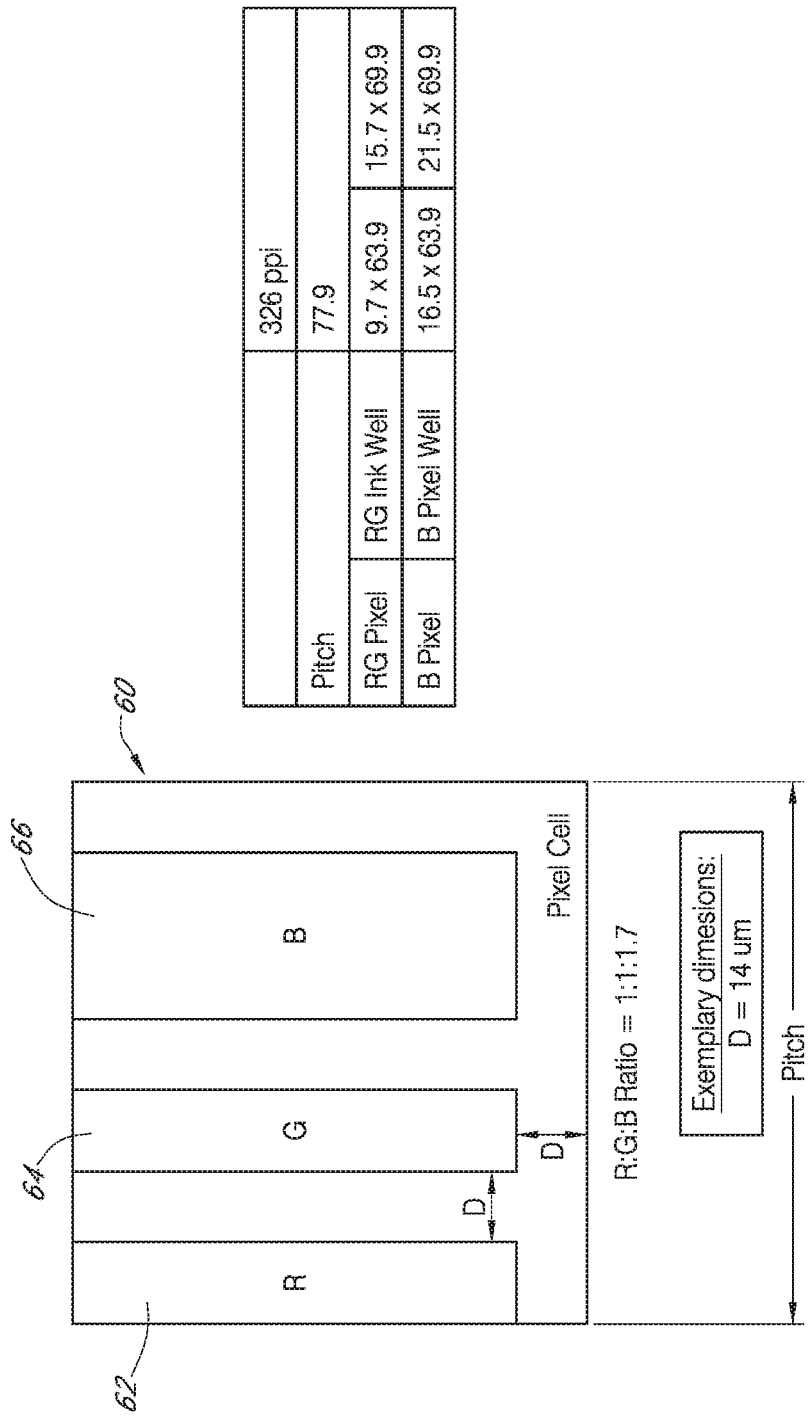
FIG. 2B is a top view that depicts a structure associated with a single pixel in accordance with the present teachings.

FIG. 2B depicts a plan view of pixel cell 60, having dimensions of between about 95µ width by about 85µ in length. In pixel cell 60, there are three different wells (62, 64 and 66) that are each used to receive layers that will define an OLED stack, one stack for a red light generating component (62), one stack for a green light generating component (64), and one stack for a blue light generating component (66). Dimensions identified within FIG. 2B identify pixel cell pitch and pixel well dimensions for each color component for a flat panel display (having a resolution of 326 pixels per inch or "ppi").

As one of ordinary skill in the art can readily appreciate, pixel size, shape, and aspect ratios can vary depending on a number of factors. For example, a pixel density corresponding to 100 ppi can be sufficient for a panel used for a computer display. By contrast, a pixel density corresponding to 300 ppi to about 450 ppi can be used for very high resolution displays. Note that a wide variety of inks can be used to form different layers for use with light of various wavelengths, such that each of wells 62, 64 and 66 do not have to use the same ink or inks. Moreover, a variety of inks can be formulated to form other layers as depicted in FIG. 1B.

The present teachings facilitate automated systems and methods for the timely inspection and objective determination of quality of a deposited layer over a large number of pixel wells of an OLED device substrate. For example, reflecting on the discussion of different substrate sizes presented earlier, it will be recalled that for many designs (e.g., Gen 5.5 to Gen 8.5), there typically are millions of pixels per panel. This number may increase dramatically in the future as additional display technologies come to fruition. As previously discussed, for proper function in an OLED device, film uniformity is desirable.

Figure 3:
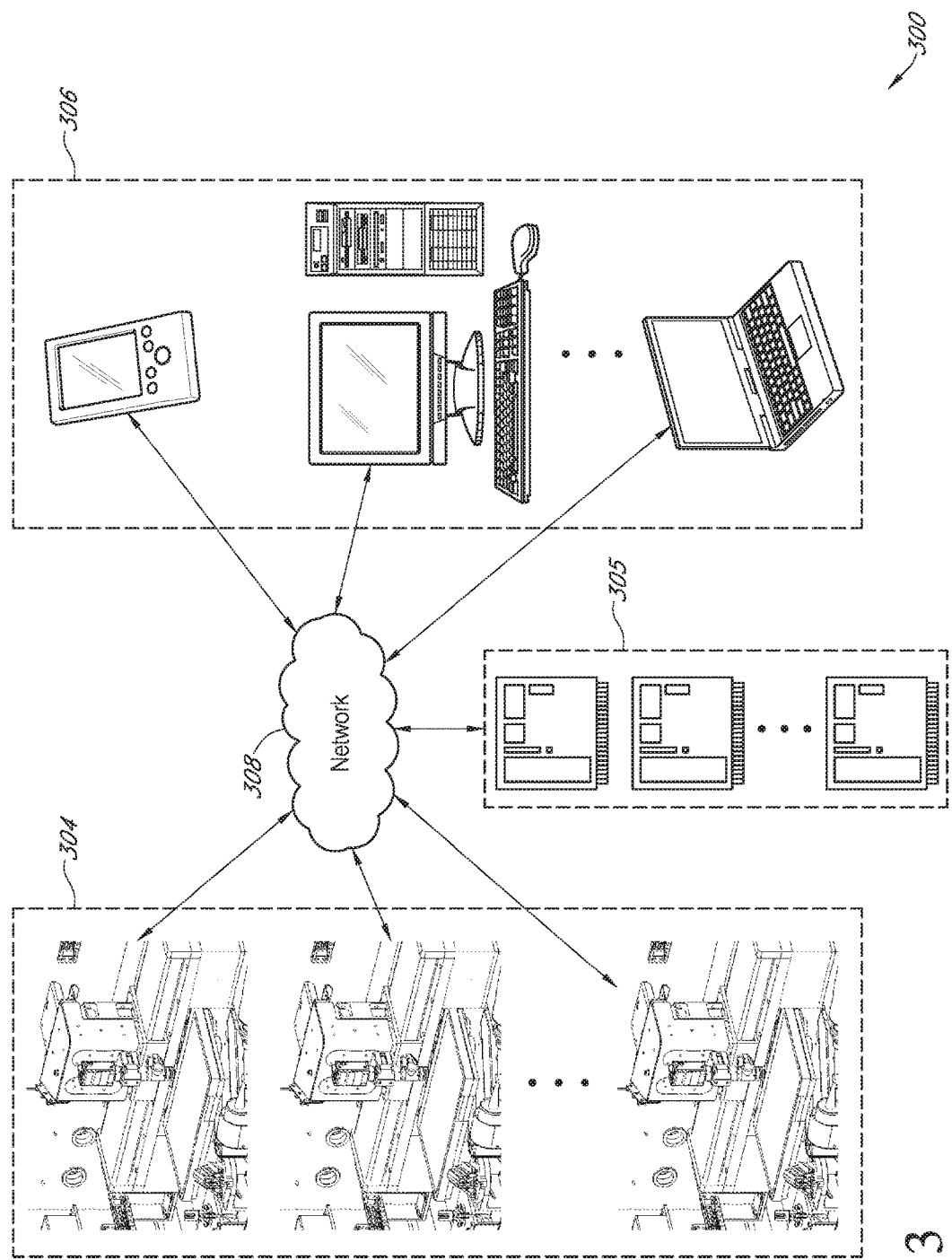
FIG. 3 depicts a schematic representation of a panel inspection system in accordance with an illustrative embodiment.

FIG. 3 is a schematic depiction of an OLED device quality assessment system 300 in accordance with an illustrative embodiment. Quality assessment system 300 can include a data collection system 304, an image processing system 306, and a network 308, as well as a data storage system 305. The data collection system 304 includes a camera, for example, a high speed CCD camera. The camera captures images representing high-magnification, high-resolution views of the OLED device substrate. The data collection system 304 can also optionally be implemented with an OLED device fabrication mechanism, including one or more printers and/or other devices. In one embodiment, the camera is carried by a transport mechanism used to position the camera as well as to position ink jet printheads used to print the various film layers. Captured images and/or other data can be stored in the storage system 305. The image processing system 306 processes the captured images and determines whether or not a pixel is defective or otherwise might not perform as designed for the application. Typically, the image processing system includes computer readable media (i.e. part of the depicted portable device, desktop computer or laptop or other processing device) that causes one or more processors of the image processing system 306 to perform this analysis. The network 308 that connects these various elements can include one or more networks of the same or different types. The network 308 can include any type of wired and wireless public or private network including but not limited to a cellular network, a Bluetooth network, a peer-to-peer network, a local area network, a wide area network such as the Internet, an internal system bus, or another scheme for connecting the various depicted devices. The network 308 can further include sub-networks and consist of any number of additional or fewer devices. The components of OLED device quality inspection system 300 can be included in a single computing device, can be positioned in a single room or adjacent rooms, in a single facility, or can be remote from one another. In various embodiments, the present teachings can be embodied in any single component illustrated in FIG. 3 or as a collection of such components, or as related methods, devices or systems.

Figure 4:
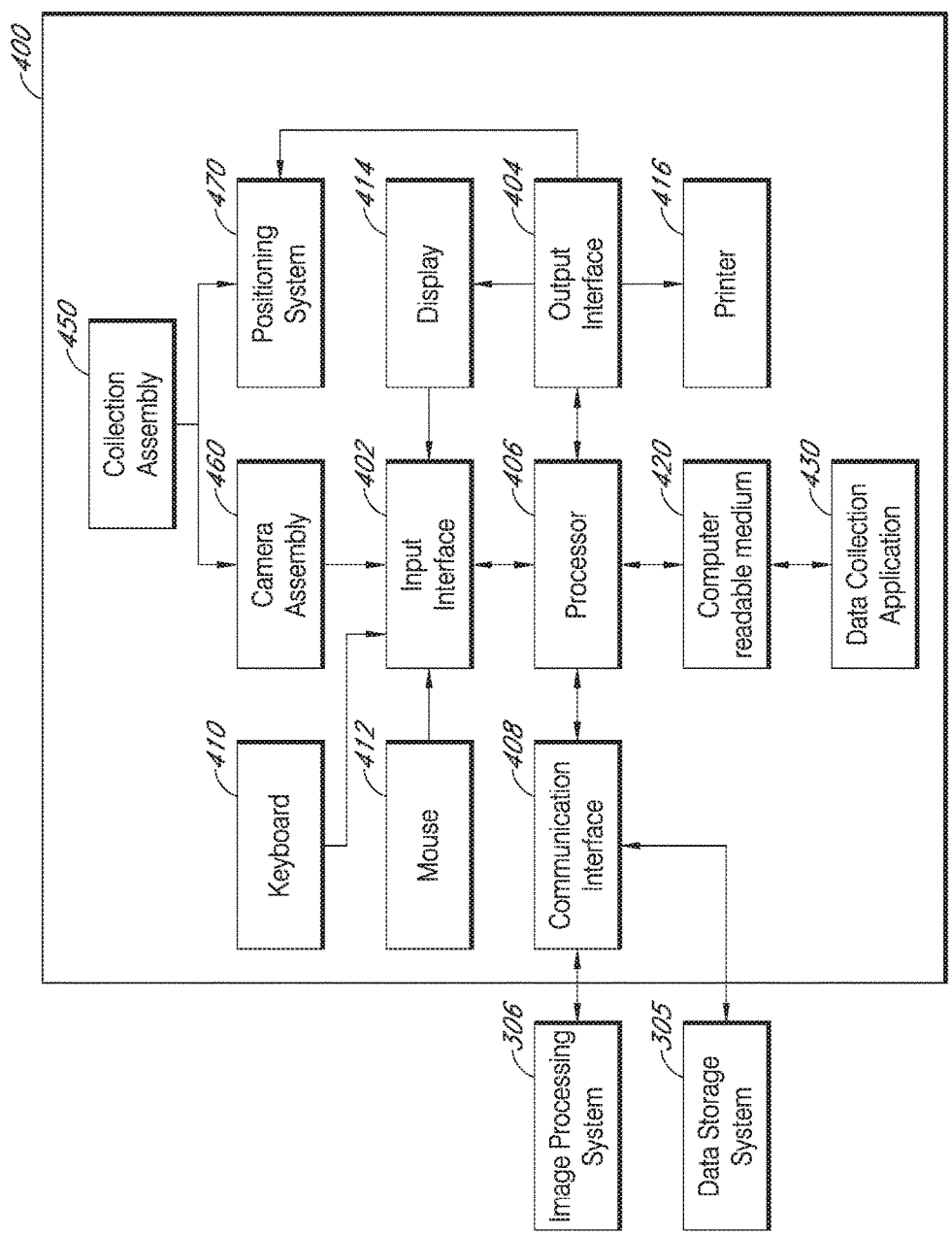
FIG. 4 depicts a block diagram of a data collection apparatus of the panel inspection system of FIG. 3 in accordance with an illustrative embodiment.

FIG. 4 shows a block diagram of a data collection apparatus 400 in accordance with an illustrative embodiment. The data collection apparatus 400 can include, to provide one non-limiting example, a collection assembly 450, a camera assembly 460, a positioning system 470 and at least one processor 406. To assist with input and output of data to the at least one processor 406, the data collection apparatus 400 can further include an input interface 402, an output interface 404, a communication interface 408, a keyboard 410, a mouse 412, a display 414, a printer 416, computer-readable medium 420 and a data collection application 430. Fewer, different, and additional components can be incorporated into the data collection apparatus 400.

With respect to collection assembly 450 of data collection apparatus 400 of FIG. 4, camera assembly 460 can optionally be configured to capture image data using a lens, as understood by a person of skill in the art. The captured image data is received into data collection apparatus 400 through input interface 402. The data collection assembly 450 can also include the positioning system 470, which is used to mount the camera assembly 460 and to transport the camera assembly relative to an OLED device substrate. In this regard, the positioning system 470 provides for travel of camera assembly 460 over the entire surface of a flat panel display. Accordingly, data collection assembly 450 of collection apparatus 400 can fully capture images representing an entire set of pixel wells of any flat panel display device. Note that as mentioned earlier, in one embodiment, the camera assembly 460 can be part of a printer (e.g., printer 416), with the processor 406 and/or collection assembly 450 also used to control print head motion. In such a system, the camera assembly 460 can be optionally integrated with a print head, so as to capture images of just-deposited "wet inks" for purposes of quality analysis. Alternatively, the camera assembly 460 can be optionally implemented as a part of a multi-tool printer where the positioning system 470 serves double-duty, at some times mounting one or more printheads for use in printing an OLED device substrate, and at other times mounting the camera assembly 460. In one embodiment, a manufacturing apparatus for OLED devices pipelines multiple substrates, such that after a layer is deposited over a first substrate in a printer, that substrate is advanced to another position within the manufacturing apparatus and is imaged for quality analysis; simultaneously, a second substrate is brought into the printer for purposes of depositing a similar layer.

Input interface 402 provides a port to receive data into data collection apparatus 400, as understood by those skilled in the art. The input interface 402 can interface with various input technologies including, but not limited to, keyboard 410, mouse 412, display 414, camera assembly 460, a track ball, a keypad, one or more buttons, etc., to allow information to be received into data collection apparatus 400 or to make selections from a user interface displayed on display 414. Keyboard 410 can be any of a variety of keyboards as understood by those skilled in the art. Display 414 can be a thin film transistor display, a light emitting diode display, a liquid crystal display, or any of a variety of different displays as understood by those skilled in the art. Mouse 412 can be any of a variety of mouse-type devices as understood by those skilled in the art. The same interface can support both input interface 402 and output interface 404. For example, display 414 can include a touch screen that supports user input and presents output to the user. Data collection apparatus 400 can have one or more input interfaces that use the same or a different input interface technology. Keyboard 410, mouse 412, display 414, camera assembly 460, etc., further can be accessible by data collection apparatus 400 through communication interface 408.

The output interface 404 can provide an interface for outputting information from data collection apparatus 400. For example, output interface 404 can interface with various output technologies including, but not limited to, a display, a printer, a camera, a positioning system, or another device if not part of the data collection apparatus 400. In at least one embodiment, the output interface 404 comprises a local area connection or a wireless connection for purposes of communicating with other network-connected elements.

The processor 406 executes instructions as understood by those skilled in the art. The instructions can be carried out by a special purpose computer, logic circuits, or hardware circuits. The term "execution" refers to the process of performing operations called for by respective instructions. The instructions can be expressed in the form of one or more programming languages, scripting languages, assembly languages, etc. The processor 406 receives instructions from a non-transitory computer-readable medium, for example, a local, network-attached or remote memory, and executes such instructions, for example by storing a copy of these instructions in local RAM and then acting on those locally-stored instructions. The data collection apparatus can also include a number of processors to perform the various functions, for example, implemented as a multi-core device, as a set of processors of an integrated device, or as a set of network-attached devices that collectively perform operations and that exchange data in association with those operations.

Figure 5:
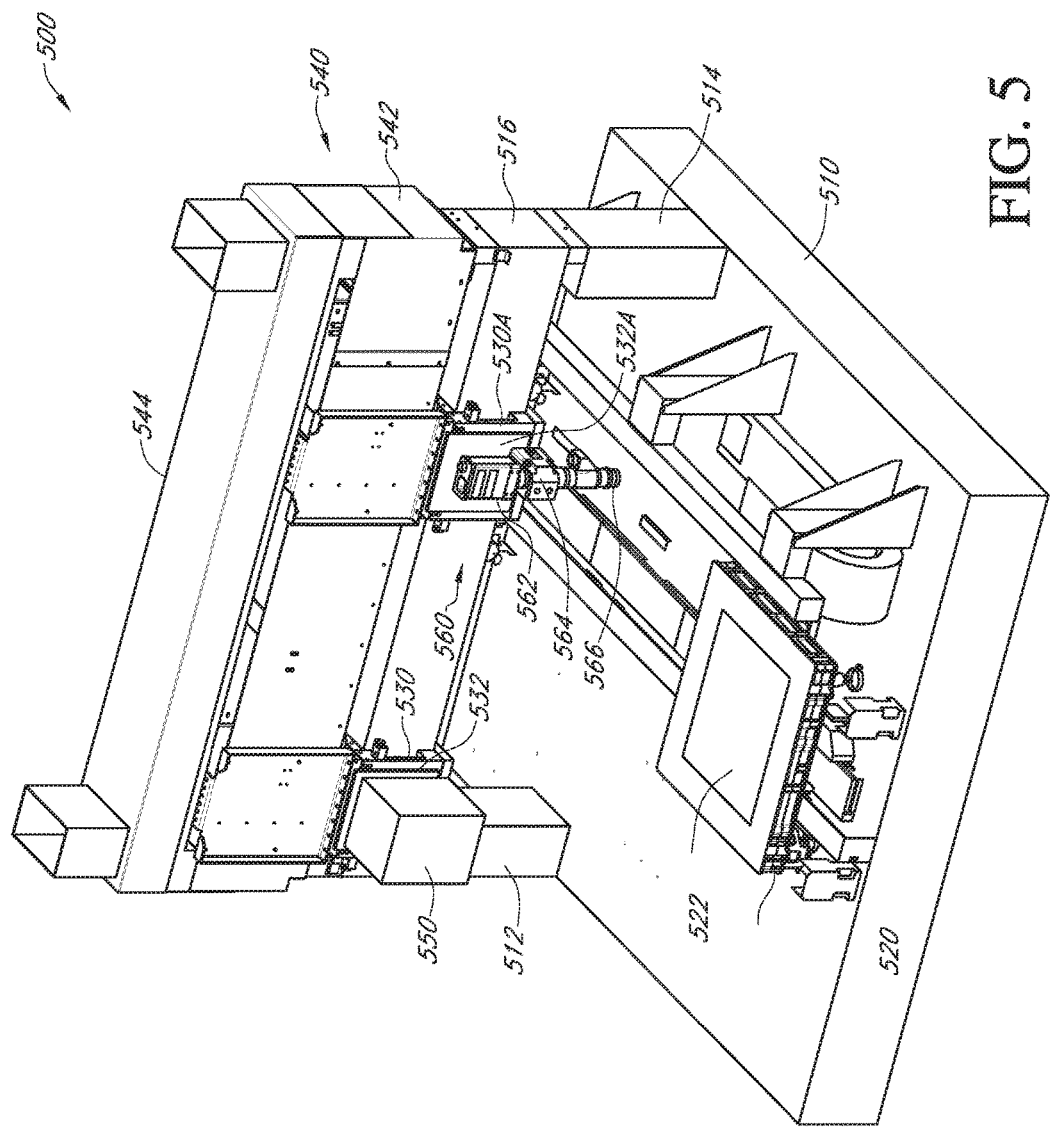
FIG. 5 depicts a printing system with a data collection assembly of FIG. 4 in accordance with an illustrative embodiment.

FIG. 5 depicts a front perspective view of an inkjet printing system 500 for printing various OLED stack layers on an OLED substrate, in accordance with an illustrative embodiment. An OLED inkjet printing system, such as inkjet printing system 500 of FIG. 5, can be comprised of several devices and apparatuses, which allow the reliable placement of ink drops onto specific locations on a substrate, such as substrate 522 positioned upon substrate support apparatus 520. These devices and apparatuses can include, without limitation, a printhead assembly, ink delivery system, motion system, substrate support apparatus, and a substrate loading and unloading system. A motion system can be, by way of non-limiting example, a gantry system or split axis XYZ system, as depicted for inkjet printing system 500 of FIG. 5. Either the printhead assembly can move over a stationary substrate (gantry style), or both the printhead and substrate can move (in the case of a split axis configuration). In another embodiment, a printhead assembly can be substantially stationary; for example, the substrate can be transported in X and Y dimensions relative to one or more printheads, with Z axis motion provided either by a substrate support apparatus or by a Z-axis motion system associated with the printhead assembly. As the one or more printheads move relative to the substrate, droplets of ink are ejected at the correct time to be deposited in the desired location on a substrate. A substrate can be inserted and removed from the printer using a substrate loading and unloading system. Depending on the configuration of an inkjet printing system, this can be accomplished using a mechanical conveyor, a substrate floatation table with a conveyance assembly, or a substrate transfer robot with end effector. Note that in one embodiment, printing is performed inside a chamber that is sealed relative to ambient air, to exclude unwanted particulate. The data collection system can also optionally be operated in this isolated environment. In one contemplated application, referenced below, the sealed chamber can be used to perform printing and/or imaging in the presence of a specifically selected atmosphere, such as an inert gas.

The inkjet printing system 500 of FIG. 5 can include a data collection assembly, as has been described previously. Various embodiments of inkjet printing system 500 can be supported by a printing system base 510. First and second risers 512 and 514 above this base support a bridge 516, used to support the printing system and the imaging system (e.g., the camera). A cable tray assembly 542 provides enclosure and routing for various cable, wire, and tubing assemblies required for the operation of inkjet printing system 500, and helps contain any particles generated by such cable, wire, and tubing assemblies. The cable tray assembly 542 is generally part of a cable tray assembly exhaust system 540, which provides for exhaust of such particles via tray exhaust plenum 544. In this regard, the cable tray exhaust assembly 540 can help facilitate a low-particle environment during the printing and/or imaging process.

The bridge 516 helps support a first X,Z-axis carriage assembly 530 and second X,Z-axis carriage assembly 530A. Each carriage assembly can move in an X-axis direction on bridge 516 relative to substrate support apparatus 520. The inkjet printing system 500 can use an intrinsically low-particle generating X-axis motion system, in which first and second X,Z carriage assemblies 530 and 530A, respectively, move on an air bearing linear slider assembly. As one of ordinary skill in the art may understand, an air bearing linear slider assembly can wrap around the entirety of bridge 516, allowing frictionless movement of first and second X,Z carriage assembly 530 and 530A. Such an air bearing linear slider assembly helps provide a three-point mounting, which preserves accuracy of travel for each X,Z carriage assembly and helps resist skew. The first X,Z-axis carriage assembly 530 has a first Z-axis moving plate 532, while the second X,Z-axis carriage assembly 530 has a second Z-axis moving plate 532A; each Z-axis moving plate helps control Z-axis movement of an apparatus mounting thereon. For inkjet printing system 500, printhead assembly 550 is depicted mounted on Z-axis moving plate 532, while camera assembly 560 is depicted mounted on Z-axis moving plate 532A. It can be readily appreciated that in various embodiments of an inkjet printing system having two X,Z-axis carriage assemblies, a printhead assembly and a camera assembly can be mounted interchangeably on either X,Z-axis carriage assembly. Other embodiments can use a single X,Z-axis carriage assembly having a printhead assembly mounted thereon, and a camera assembly mounted proximate to the printhead assembly.

In various embodiments of inkjet printing system 500, a substrate support apparatus 520 can be a floatation table that provides for frictionless support of substrate 522; in other embodiments, the substrate support apparatus 520 can be a chuck. The Y-axis motion system 524, depicted in FIG. 5 as a unitary rail system, can utilize a linear air bearing motion system or a linear mechanical bearing motion system; the air bearing motion system helps facilitation frictionless conveyance of substrate 520 in the Y-axis direction. The Y-axis motion system 524 can also optionally use dual rail motion, once again, provided by a linear air bearing motion system or a linear mechanical bearing motion system.

A camera assembly 560 as depicted in FIG. 5 can include a camera 562, a camera mount assembly 564 and a lens assembly 568. The lens assembly can be mounted to the Z-axis moving plate 532A via the camera mount assembly 564. The camera 562 can be any image sensor device that converts an optical image into an electronic signal, such as by way of non-limiting example, a charge-coupled device (CCD), a complementary metal-oxide-semiconductor (CMOS) device or N-type metal-oxide-semiconductor (NMOS) device. As depicted in FIG. 5, the Z-axis moving plate 532A can controllably adjust the Z-axis position of camera assembly 560 relative to substrate 522. During various processes, such as for example, printing and data collection, substrate 522 can be controllably positioned relative to the camera assembly 560 using the Y-axis motion system 524. The camera assembly 560 as depicted in FIG. 5 can also be controllably positioned relative to substrate 522 via X-axis movement via carriage assembly 530B mounted on the bridge. Accordingly, the split axis motion system of FIG. 5 can provide precise positioning of the camera assembly 560 and substrate 522 relative to one another in three dimensions in order to capture image data on any part of the substrate 522 at any desired focus and/or height. As previously mentioned, other motion systems, such as a gantry motion system, can also be used to provide precision movement in three dimensions between, for example, a printhead assembly and/or a camera assembly, relative to a substrate. In either embodiment, a motion system can position camera assembly 560 relative to substrate 522 using a continuous or a stepped motion or a combination thereof to capture a series of one or more images of the surface of substrate 522. Each image can encompass an area associated with one or more pixel wells, individual pixels, or any combination thereof and including the surrounding surface area (e.g., encompassing for example associated electronic circuitry components, pathways and connectors). Any of a variety of cameras can be used that can have a relatively large field of view (>0.5 mm) while providing fairly fine granularity (3 micron per pixel resolution).

Figure 6:
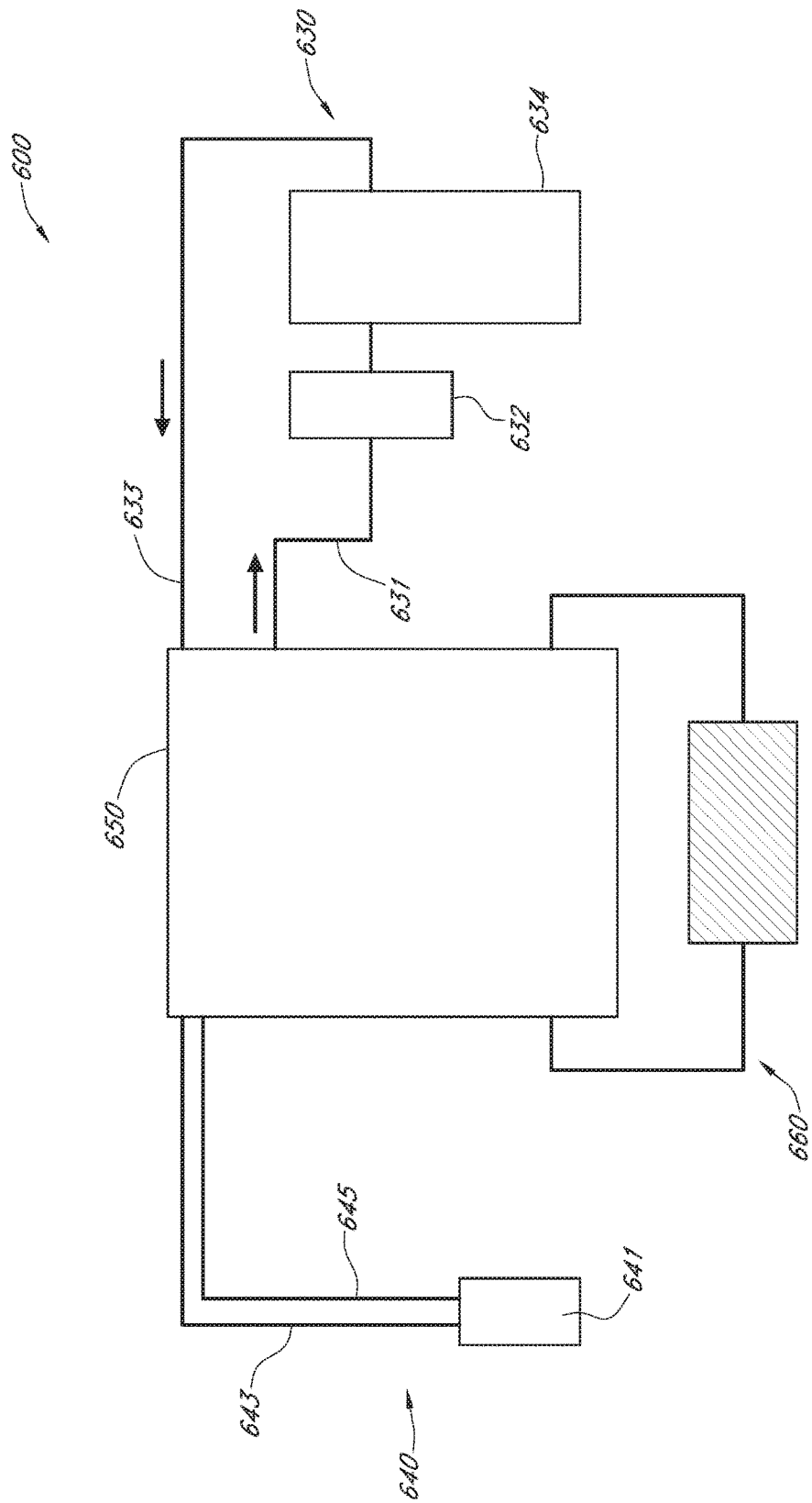
FIG. 6 is a schematic section view of a gas enclosure system that can house a printing system, such as various embodiments of a printing system of FIG. 5.

FIG. 6 is a schematic representation of a gas enclosure system 600 that can house a printing system, as referenced earlier. The gas enclosure system 600 can comprise a gas enclosure assembly 650, a gas purification loop 630 in fluid communication with gas enclosure assembly 650, and at least one thermal regulation system 640. Additionally, various embodiments of a gas enclosure system can have pressurized inert gas recirculation system 660, which can supply inert gas for operating various devices of an OLED printing system, such as a substrate floatation table, an air bearing linear slider assembly, and a linear air bearing assembly. Various embodiments of a pressurized inert gas recirculation system 660 can utilize a compressor, a blower and combinations of the two as sources for various embodiments of inert gas recirculation system 660. Additionally, gas enclosure system 600 can have a filtration and circulation system (not shown) internal to gas enclosure system 600, which along with other components, such as a cable tray exhaust assembly, a substrate floatation table, an air bearing linear slider assembly, and a linear air bearing assembly, can provide a substantially low-particle printing environment.

As depicted in FIG. 6, for various embodiments of gas enclosure assembly 600, a gas purification loop 630 can include an outlet line 631 from gas enclosure assembly 650 to a solvent removal component 632, with ensuing coupling to a gas purification system 634. Inert gas purified of solvent and other reactive gas species, such as oxygen and water vapor, are then returned to gas enclosure assembly 650 through inlet line 633. The gas purification loop 630 can also include appropriate conduits and connections, and sensors, for example, oxygen, water vapor and solvent vapor sensors. A gas circulating unit, such as a fan, blower or motor and the like, can be separately provided or integrated (e.g., in gas purification system 634) to circulate gas through gas purification loop 630. Though the solvent removal system 632 and the gas purification system 634 are shown as separate units in FIG. 6, the solvent removal system 632 and the gas purification system 634 can also be housed together as a single purification unit. Each thermal regulation system 640 can include, for example, at least one chiller 641 (e.g., which can have fluid outlet line 643 for circulating a coolant into a gas enclosure assembly) and a fluid inlet line 645 for returning the coolant to the chiller.

For various embodiments of gas enclosure assembly 600, a gas source can be an inert gas, such as nitrogen, any of the noble gases, and any combination thereof. For various embodiments of gas enclosure assembly 600, a gas source can be a source of a gas such as clean dry air (CDA). For various embodiments of gas enclosure assembly 600, a gas source can be a source supplying a combination of an inert gas and a gas such as CDA.

The system 600 also helps maintain levels for various reactive gas species as needed, including gases such as water vapor, oxygen and/or organic solvent vapors at 100 ppm or lower (for example, at 10 ppm or lower, at 1.0 ppm or lower, or at 0.1 ppm or lower). Further, the gas enclosure system 600 helps provide a low particle environment meeting a range of specifications for airborne particulate matter according to ISO 14644 Class 1 through Class 5 clean room standards.

Note that as referenced earlier, the gas enclosure system 600 supports printing and/or imaging. For example, the gas enclosure system can use a substrate floatation table, an air bearing linear slider assembly, and/or a linear air bearing assembly, to move a substrate into and out of a printer. The gas enclosure system can also optionally enclose a data collection apparatus (e.g., such as a camera, camera positioning systems and other image capture elements), as discussed above.

Figure 7A:
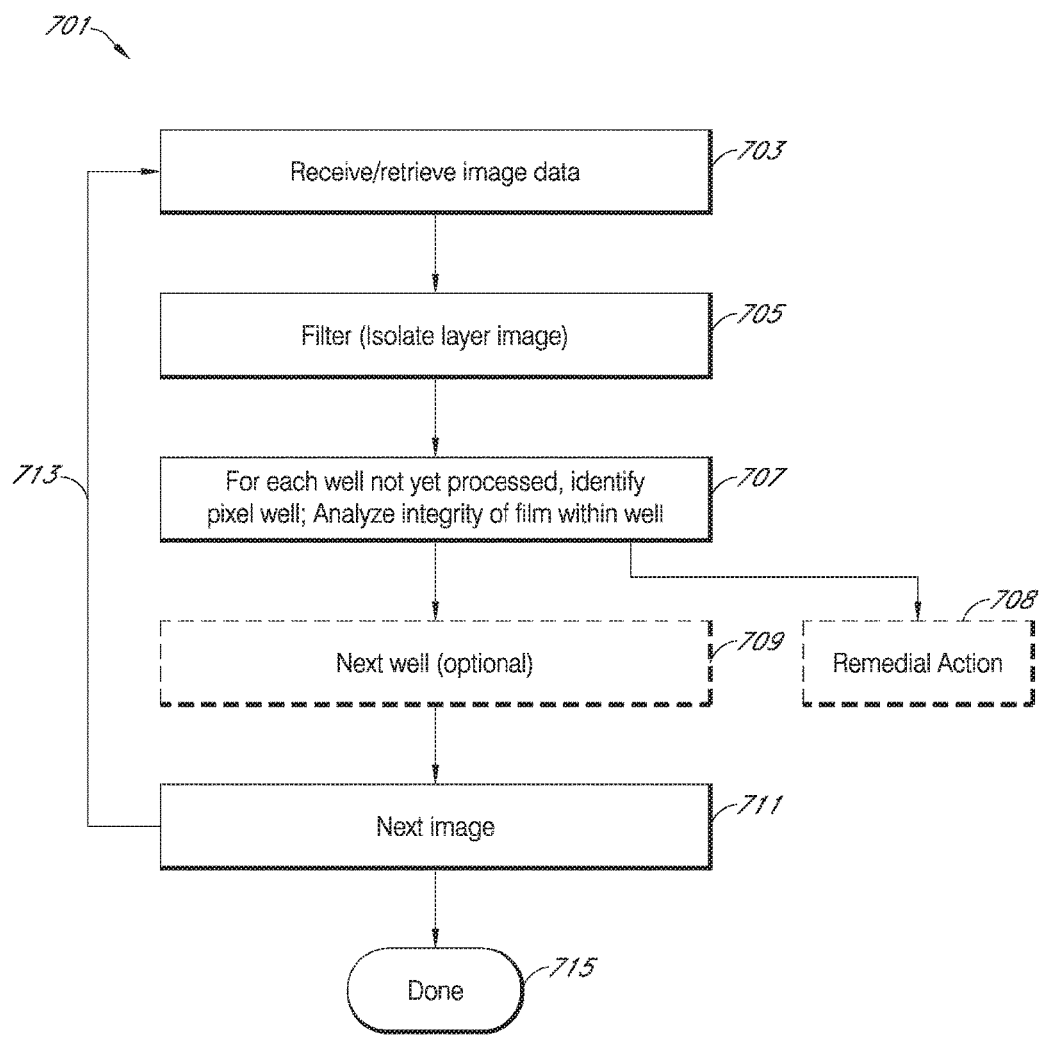
FIG. 7A through FIG. 7D depict various flow diagrams illustrating example operations performed by an image processing application of a data collection apparatus in accordance with various embodiments of systems and methods of the present teachings.

FIG. 7A shows a flow chart 701 associated with one method for processing image data. This method can optionally be implemented as instructions stored on computer-readable media, i.e., as software or firmware which controls one or more processors as introduced earlier. As depicted by numeral 703, captured image data is first received by the processor. Such data could have been captured under the control of the processor, or it could be retrieved from a file stored locally or remotely; in one embodiment, the captured image data is received directly from the camera at the time it captures each image as a "stream" of captured images as the camera is continuously or stepwise scanned over various pixel wells. Captured image data is then filtered (705) to isolate a deposited film (or films) of interest. For filtered data produced as a result of this process, for example, representing image data associated with the interiors of one or more pixel wells, film integrity is then analyzed (707). Note that it was earlier-mentioned that in one embodiment, this analysis is performed upon a finished layer following any post-printing finishing steps. In another embodiment, this analysis (and image capture) can be performed on still-wet ink, for example, to identify situations where a fill is incomplete, where an air bubble exists within the ink, or another potential defect. In various embodiments, remedial efforts (708) can be taken in response to a detected defect. For example, the OLED device substrate can be discarded (thereby potentially saving additional time and deposition expense), or alternatively, a defect can be fixed by removing the deposited layer, by adding to the deposited layer, or by further processing the deposited layer. If the analysis is performed on a wet ink for example, the wet ink can be removed and deposition reperformed; if an air bubble exists, the ink can be heated or otherwise processed to eliminate the air bubble; if a fill is incomplete, additional ink can be added at precise locations to complete the fill. Many other possible remedial measures exist, providing for a substantially more efficient manufacturing process.

If no defect is identified, processing then continues to the next pixel well (709). Note that this function is depicted in dashed-lines to indicate its optional nature. In an embodiment that scrutinizes layers in multiple wells at-once, a given captured image may represent more than one pixel well and potentially more than one deposited layer or ink that requires analysis. Numeral 709 indicates that should this be the case, the captured image received in step 703 can be further processed for such additional pixel wells, if any. In one embodiment, each captured image encompasses an area associated with one or more pixels, in a second embodiment, each captured image encompasses (or is filtered to identify) only a single pixel well, and in a third embodiment, multiple pixel wells representing one or more pixels or a subset of one or more pixels can be processed at-once. If a given captured image has been fully processed, or if additional pixel wells still require analysis for a given deposition, the method then loops to consider a different captured image, as represented by numerals 711 and 713. If all pixel wells have been evaluated and pass desired quality thresholds, i.e., no defects are detected, the analysis then completes, as indicated by reference numeral 715.

Figure 7B:
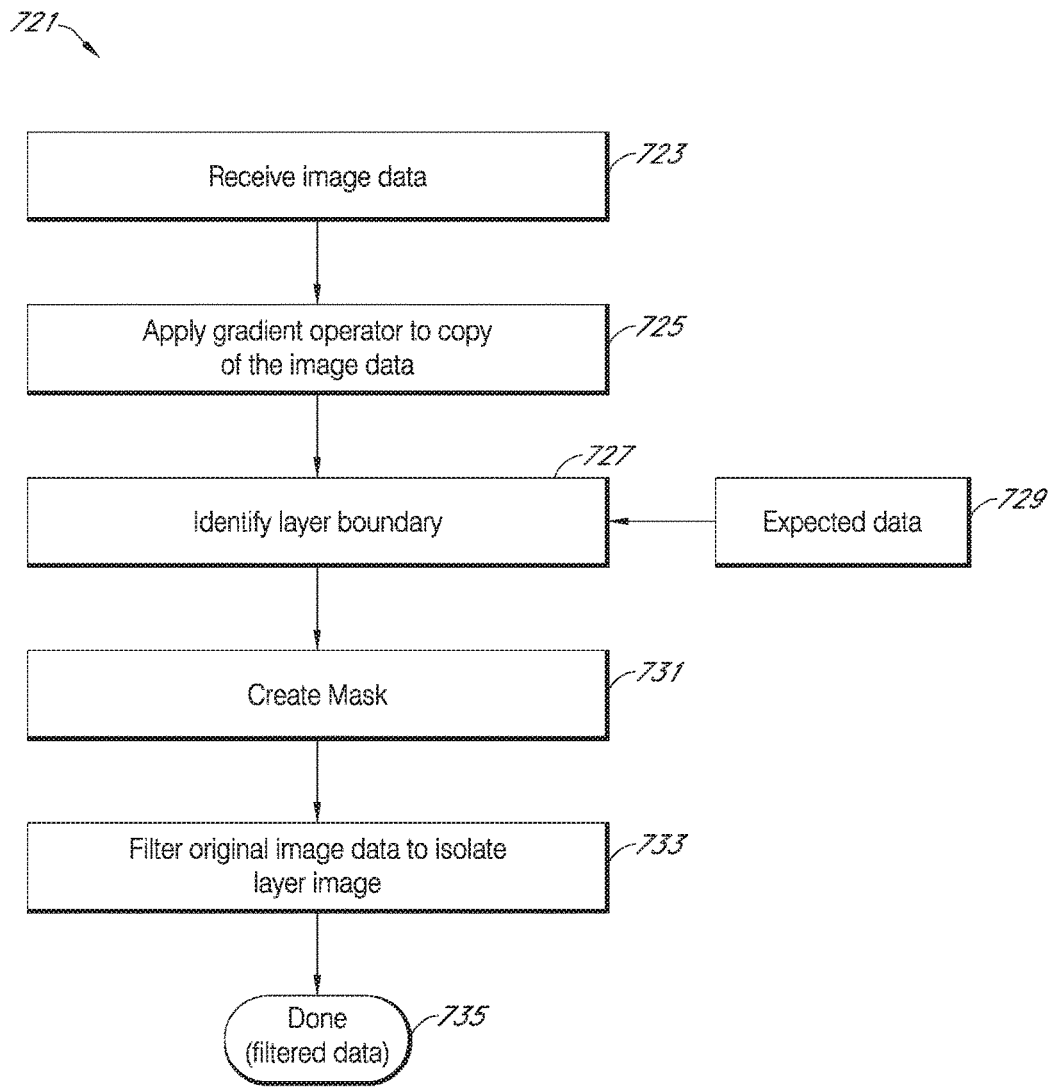
Figure 8D:
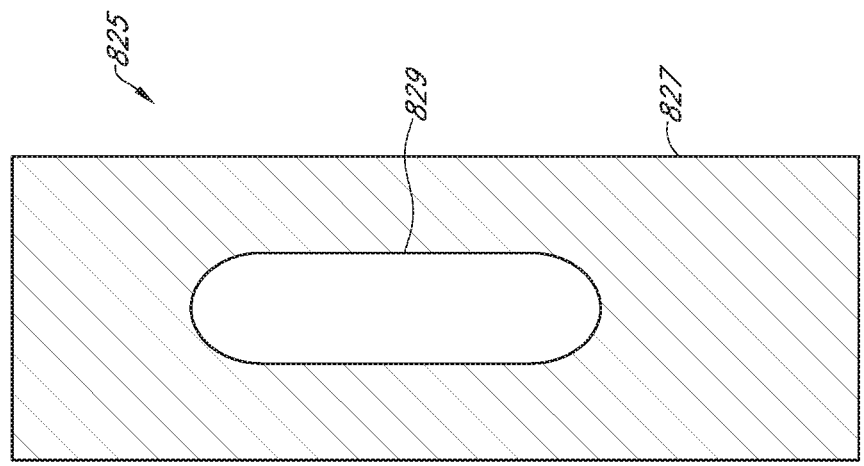
Figure 8C:
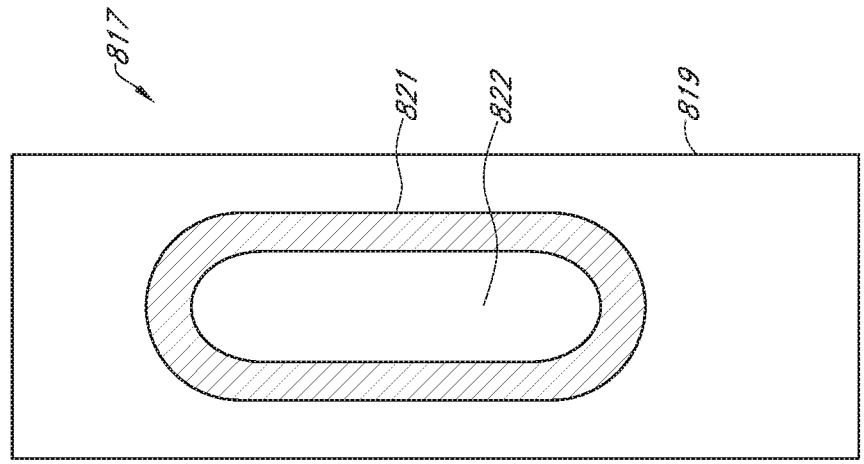

FIG. 7B is used to provide additional detail on an exemplary filtering operation, used to isolate image data corresponding to just a deposited layer under scrutiny. This filtering operation is generally identified by a series of steps 721. As indicated by numeral 723, image data corresponding to a captured image is received and stored in fast-access memory, such as RAM. The image can be received on the fly, or can be retrieved from machine-readable media, as mentioned. Note that FIG. 8A provides an example of one hypothetical image, showing about two and one half pixel wells in a single view. In one embodiment, processing focuses on one of these pixel wells at a time, while in another embodiment, multiple pixel wells (such as wells 807 and 809) can be considered simultaneously. A boundary detection function (725) is then applied to isolate expected metes and bounds of the deposited layer under scrutiny. Optionally, such a detection function can also be applied using a gradient function, i.e., which enables identification of a boundary or contour (727) corresponding to layer periphery. Such a contour for example can be compared to expected data (729) to determine adequacy of fill. For example, looking ahead to FIGS. 8A-8F, the existence of an area of incomplete fill (832) can be detected by comparing data for a reference pixel well (FIG. 8C) with filtered image data for a deposited layer (FIG. 8D) to ascertain certain types of deposition errors or discrepancies. Whether or not layer metes and bounds are compared at this point to reference data, the identification of a pixel bank through image analysis (e.g., gradient analysis) can be used to create a mask (731) and used to isolate image data corresponding to contents of a pixel well. Such a mask is represented by numeral 825 in FIG. 8D, with the mask then being applied to the filter the original captured image to produce filtered data which isolates (733) contents of one or more pixel wells under analysis. The filtering operation then terminates for a given well in a given image (735).

Figure 7C:
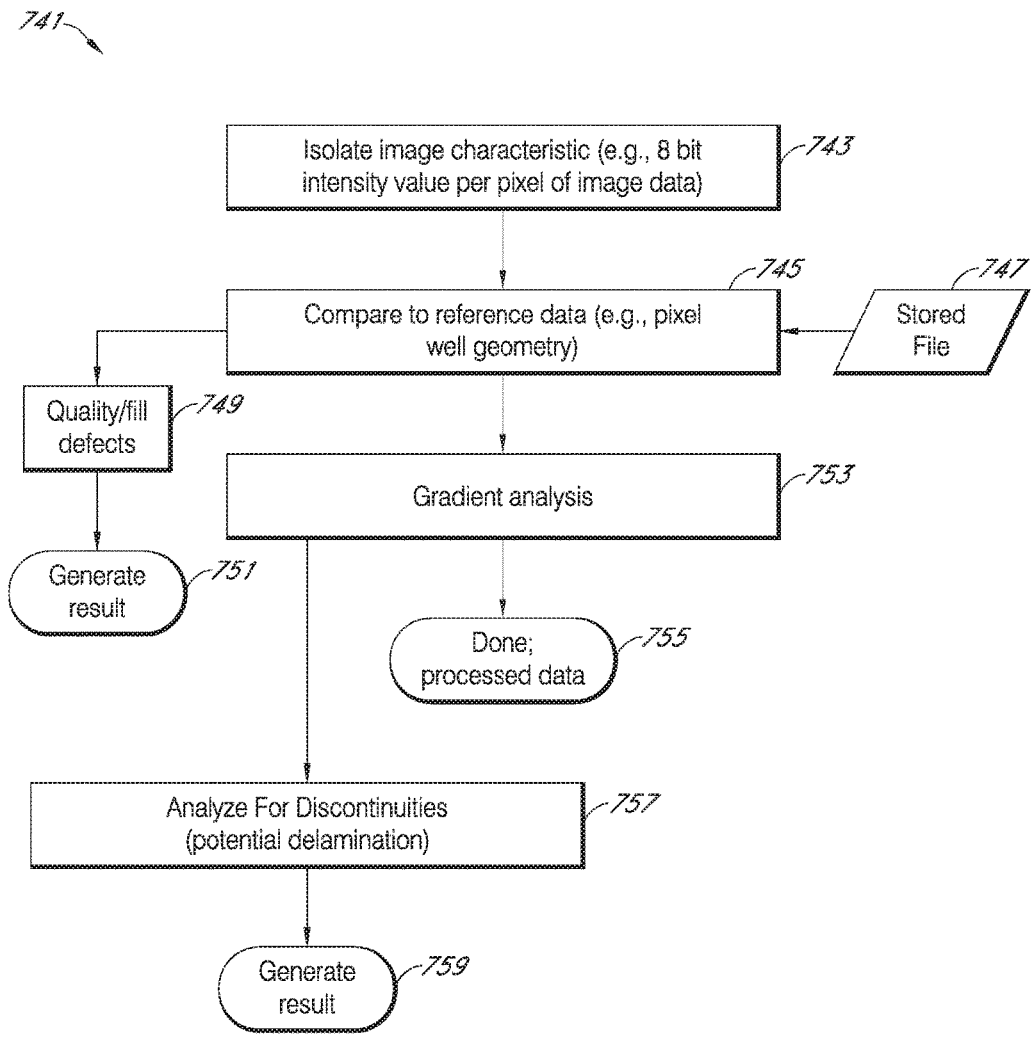

FIG. 7C is used to discuss processing of filtered data including optional boundary processing, introduced above in reference to numerals 727 and 729, and the application of a gradient function to identify discontinuities within image data representing a deposited layer. This processing is generally represented by a series of steps, identified by reference numeral 741 in FIG. 7C. As with the other flow charts discussed herein, the method represented in FIG. 7C can once again be performed by one or more processors acting under the auspices of instructions stored on computer-readable media. In connection with the processing of FIG. 7A, it is assumed that filtered image data is available per-well in order to assess quality of the deposited film layer within each given well.

For filtered data, an image characteristic is optionally isolated, per process 743, and used to assess quality of the subject layer. This image characteristic can include, without limitation, color intensity, hue, brightness, or other characteristics. In one embodiment, to be further discussed below, color data is converted to a brightness value according to a well-known formula that combines intensities of multiple color components, e.g., to obtain a grayscale intensity. Other possibilities are also possible, such as focusing processing on a given color value only, a color difference value, or some other measure. Emphasized data representing the desired characteristic (or the filtered data) is then compared to stored file data corresponding to the expected pattern for the layer within the particular print well (e.g., the expected contour), per numerals 745 and 747, in an optional process to detect underfill. For example, as mentioned in reference to FIGS. 8A-8F, the selected characteristic can be compared to outline data from a stored file indicating the expected contours of the deposited layer. Image processing software can, as part of this comparison, perform contour analysis to determine whether there is an error, whether that error rises to the level of a quality or fill defect (749), and whether a special remedial measure should be taken in view of any identified defect (751). Note that any type of error measure or comparison process can be used. For example, if there is an error in contour of the deposited layer, but the error falls below a given criterion or set of criteria or an area threshold, the pixel well contours can still be found acceptable. To cite another example, some applications may be agnostic to a deposited layer contour that exceeds the expected well boundaries, i.e., error can be electively associated with areas of shortfall only. Many other possible criteria can be used. If contours (e.g., boundaries) of the deposited layer are found to be acceptable, the deposited layer can then be analyzed for gradients within the deposited layer (i.e., for discontinuities that might represent pixel performance issues).

As part of this analysis, a gradient function is applied to image data (i.e., the filtered or emphasized data) to identify non-uniformities in the deposited layer, per numeral 753. In one embodiment, the gradient filter essentially operates as a high-pass filter, such that lack of spatial variation results in a zero value for each PEL, while gradients (or discontinuities) result in non-zero attributes (for example, an intensity difference between 8-bit intensity values for adjacent PELs, e.g., also having an 8-bit absolute value, 0-255). This need not be the case for all embodiments, e.g., it is possible to use processing that provides zero or negative value outputs to indicate discontinuities; clearly, many variations exist. The result of gradient analysis is processed data comprising a set of values where each value indicates whether or not a gradient or other discontinuity exists in the dimension of the selected image characteristic. This is represented by numeral 755 in FIG. 7C. Note that nearly any error measure can once again be used to determine whether an issue such as delamination exists, or whether there is another substantial issue (757). If such an issue does exist, a result can be generated (759), once again, affecting further processing or otherwise leading to another form of remedial measure. Once all image data for a given pixel well has been processed, the method proceeds to the next pixel well (755).

Figure 7D:
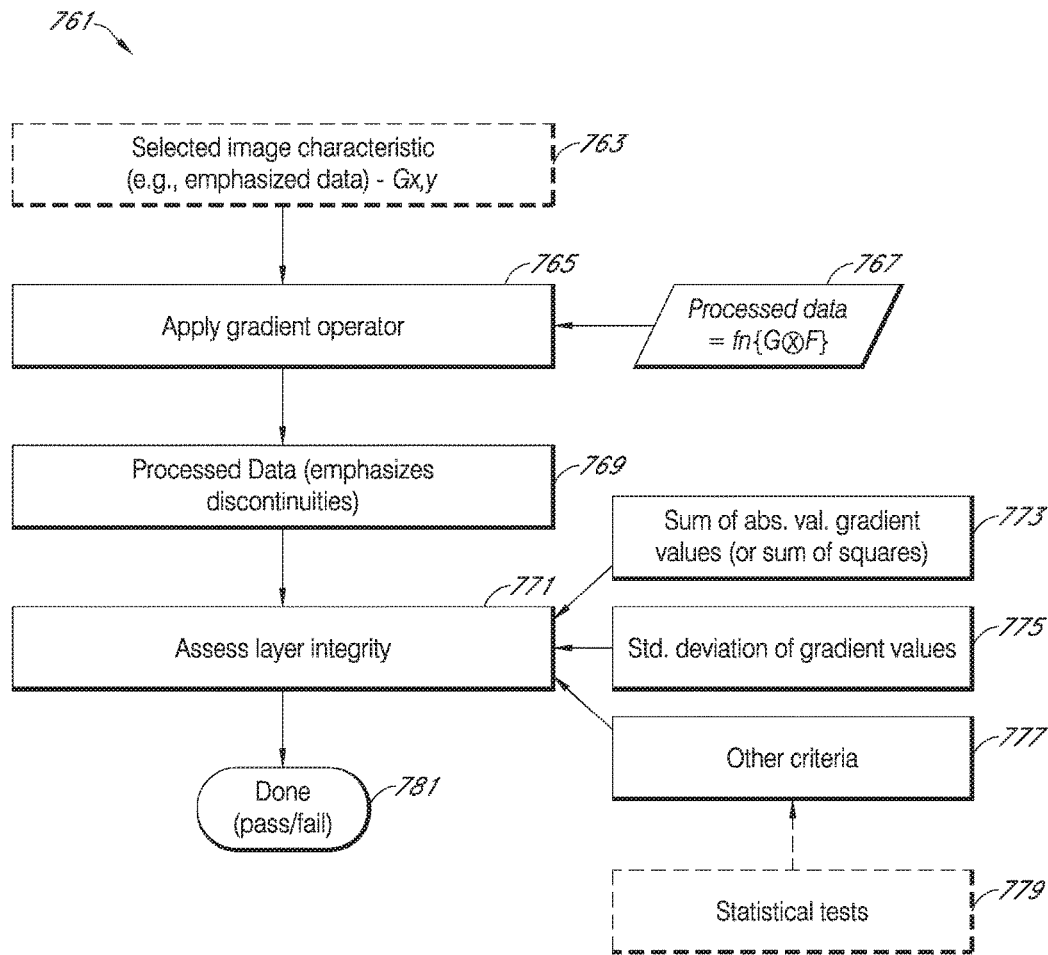

FIG. 7D is a flow chart that identifies additional specific processing associated in one embodiment with gradient analysis and associated quality analysis. The method of FIG. 7D is generally designated by reference numeral 761. As indicated by numeral 763, filtered image data is optionally simplified as mentioned to emphasize a selected characteristic (e.g. intensity as referenced above); again, any desired image attribute can be used, and it is possible also to operate simply on the raw or filtered image data itself. The data selected for processing (G) is extracted as a series of overlapping tiles and convolved with a gradient operator (represented by the matrix designator F), per process 765 and function 767; this operation results in processed data. In one embodiment, a very simple operator is used to track very high frequency variation, essentially operating as a high-pass filter between adjacent PELs. In this regard, the operator can be a matrix that convolves each PEL with its immediate neighbor in the filtered data (or emphasized characteristic of that data, such as intensity), and produces a value dependent on differences. In one embodiment, the resultant value is zero for continuous image data and a non-zero value if there are differences (discontinuities) with one or more immediate neighboring PELs. The result of this operation is typically a set of processed data 769 (e.g., result values or gradient values for each PEL represented by the filtered data, where each gradient value both emphasizes the existence of a discontinuity or gradient and quantifies the magnitude of such a discontinuity). These various gradient values are then processed to detect possible quality issues associated with a layer in the pixel well under consideration (771). A variety of measures can be used to make this assessment. For example, as seen at the right side of FIG. 7D and as represented by numeral 773, in one embodiment, the absolute values of the gradient values can be summed together, with the sum then being compared to a threshold. For example, a sum of sign-less gradient values for the entire well under consideration can be compared to an empirically-determined reference value (e.g., "250000"). If the aggregate gradient magnitudes are smaller than this reference value, then the pixel well can be determined to be healthy (e.g., pass) and if not, then the pixel well can be determined to have issues.

Clearly, many other criteria can also be applied. In a second option, represented by box 775 in FIG. 7D, the gradient values can be compared to one or more statistical measures; for example, as indicated, a variance or standard deviation of the gradient values can be compared to a threshold (e.g., and the pixel well "passed" for the particular layer deposition if the variance or standard deviation is small relative to the threshold. Clearly, many examples are possible, as represented by the box labeled "other criteria" (777) in FIG. 7D, including any form of statistical test (779). Note that a combination of measures can also be used; in one specifically-contemplated embodiment, both a sum of gradient magnitudes and a statistical measure (e.g., variance or std. deviation) for a given pixel well are calculated and compared to thresholds, with the deposited layer "passed" if the sum and the variance are both small relative to respective thresholds.

Per numeral 781, if the layer is determined to pass for all pixel wells associated with a particular layer deposition, then processing of the OLED device substrate can then continue, for example, with the addition of another pixel well layer, a panel encapsulation layer, or some other process; alternatively, if an issue has been detected, processing can be interrupted, or a remedial measure can be taken in an attempt to fix the identified issue and to salvage the OLED device substrate in question.

FIGS. 8A-8F are used to further exemplify the various processes discussed above.

FIG. 8A represents one hypothetical example of a captured image 801. This image is seen to encompass three pixel wells formed on a substrate 803, including part of a first pixel well 805, a second pixel well 807 and a third pixel well 809. These various pixel wells can form part of circuitry for a single pixel of the OLED device, though this is not required. As denoted by numeral 811, each pixel well can have associated traces and electronics used to control light generation by light emissive layers within a corresponding one of the pixel wells. Note that of the three pixel wells, the middle well 807 is illustrated to have a hypothetical misfill 832 (as a deposited layer does not reach the bank in this area) and a defect within an area of a deposited layer, as referenced by numeral 835.

FIG. 8B by contrast represents an optional step of trimming image data to focus on one pixel well at a time only, namely, the middle well 807 from FIG. 8A. Note that in one embodiment, multiple pixel wells can be analyzed at the same time (e.g., if those wells have received the same layer material via a printing process) and in another embodiment, only one well is processed at a time. In FIG. 8B, it is seen that image data 815 encompasses the well area 807, the bank structure 816 that serves to confine deposited fluids within the well, and superfluous image data 813, for example, representing supporting structures and electronics 811 outside of the confines of the bank structure.

As referenced earlier, in one embodiment, captured image data such as represented by FIG. 8A or FIG. 8B is filtered to eliminate superfluous image data. In one embodiment, this filtering is performed using boundary analysis, such as a second gradient function or other processing that detects bank structure 816. In another embodiment, boundaries of a deposited layer can be identified and compared with reference data (designated by reference numeral 822 in FIG. 8C) and used to determine whether there is a fill defect. Regardless of specific method, these operations can be used to produce a mask that will be used for this purpose—the mask is illustrated in FIG. 8D by numeral 825. Image data (e.g., from FIG. 8B) which is matched to hatched region 827 will be masked out and not used, and image data which is matched to clear region 829 will not be filtered and will be used in subsequent gradient analysis.

Figure 8F:
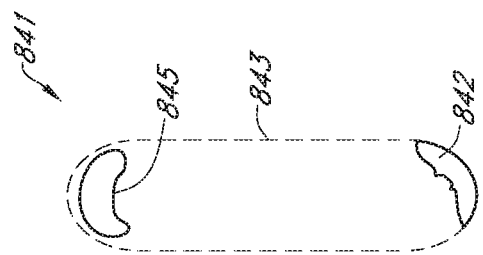
Figure 8E:
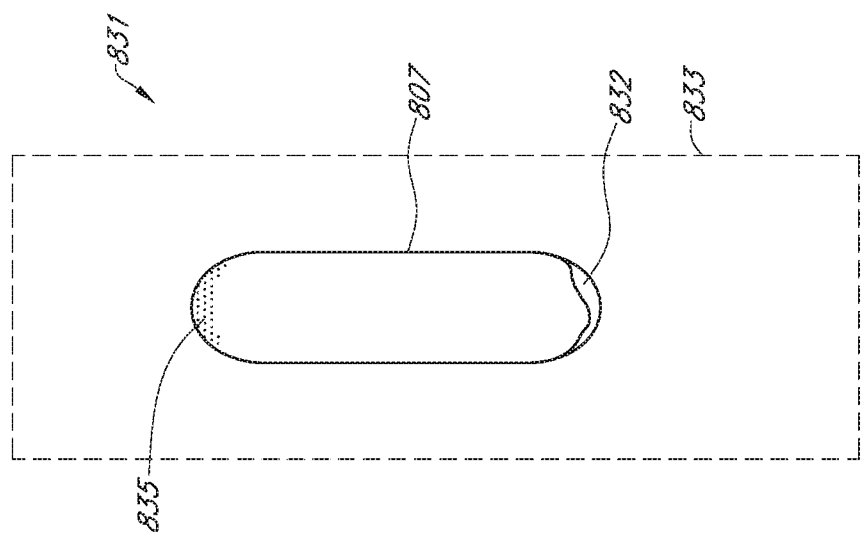

The result of the filtering operation is depicted in FIG. 8E by reference numeral 831. Generally speaking, in this embodiment, the filtered data includes image data corresponding to the pixel well confines (oval 807), null data in other areas (e.g., per numeral 833), and variable image data corresponding to the potential defects represented by numeral 832 and 835. At this point, optional analysis can be performed to identify a fill issue such as designated by numeral 832. For example, if the method is applied following deposition of a wet ink (e.g., as opposed to a finished, cured layer) it is expected that region 832 would have substantially different color characteristics that can be identified using a color filter, applied in one embodiment. Depending on the nature of the defect, a remedial measure can be applied in an attempt to remedy the issue. Note that numeral 835, representing a possible defect within the deposited layer, may possess general color characteristics of the deposited layer and so may remain unidentified at this stage, depending on the nature of processing applied.

FIG. 8F represents processed data 841, generally the result of application of a gradient filter (not shown). In this FIG., values corresponding to each PEL (e.g., of FIGS. 8B-8E) are shown as having null values except for those values corresponding to discontinuities 842 or 845, represented as a gradient contour or nested set of contours; dashed line 843 is superimposed on this FIG. simply to identify pixel well contours. Note that while layer discontinuity 835 might have remained undetected prior to the application of the gradient filter, the result of gradient filter application highlights intensity differences that could represent an issue, for example, delamination of one or more OLED stack layers.

Figure 9:
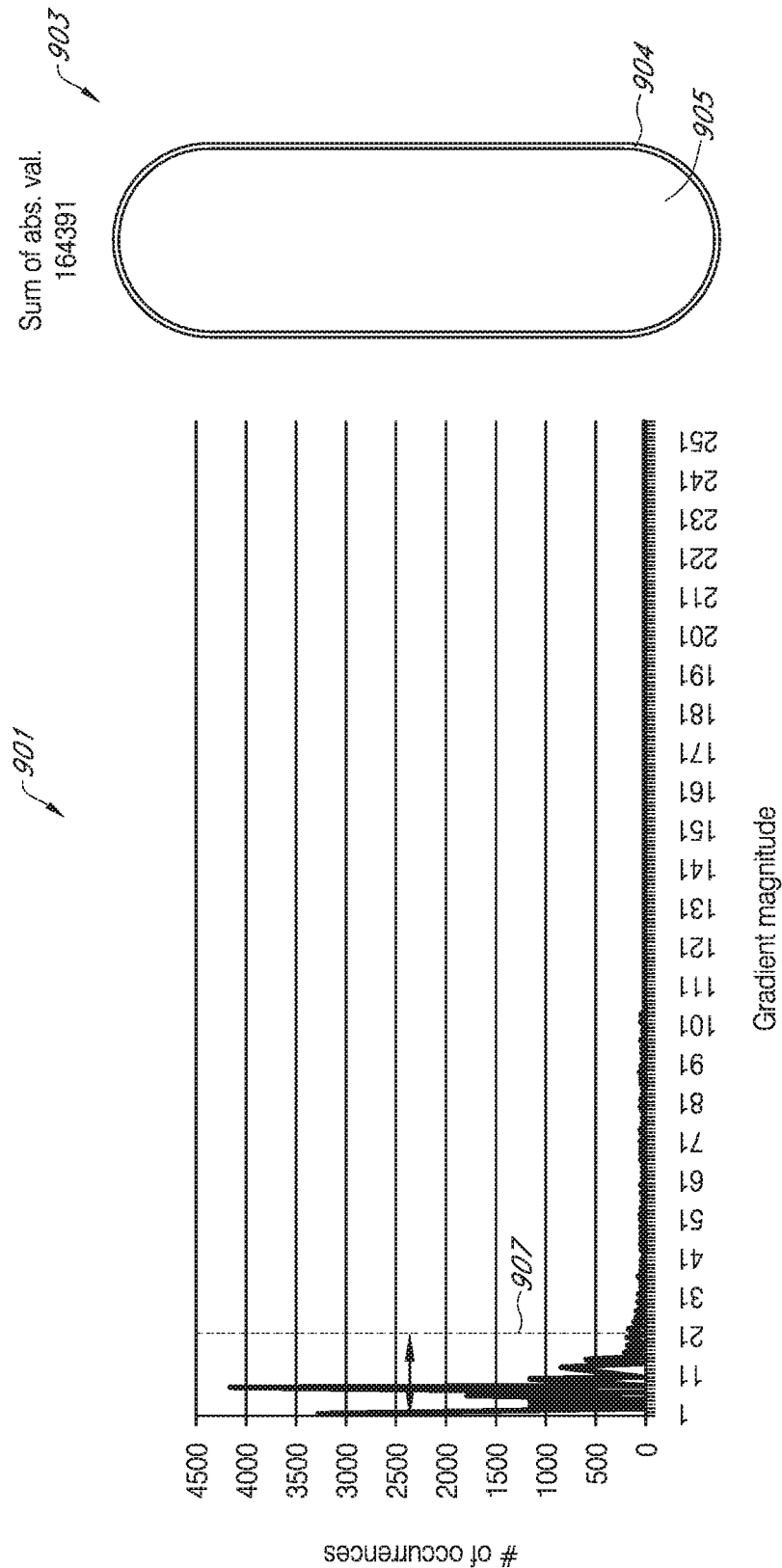
FIG. 9 illustrates a histogram of gradient intensities, corresponding to a representation of a deposited layer within a pixel well, seen to the left-side of FIG. 9.
Figure 10:
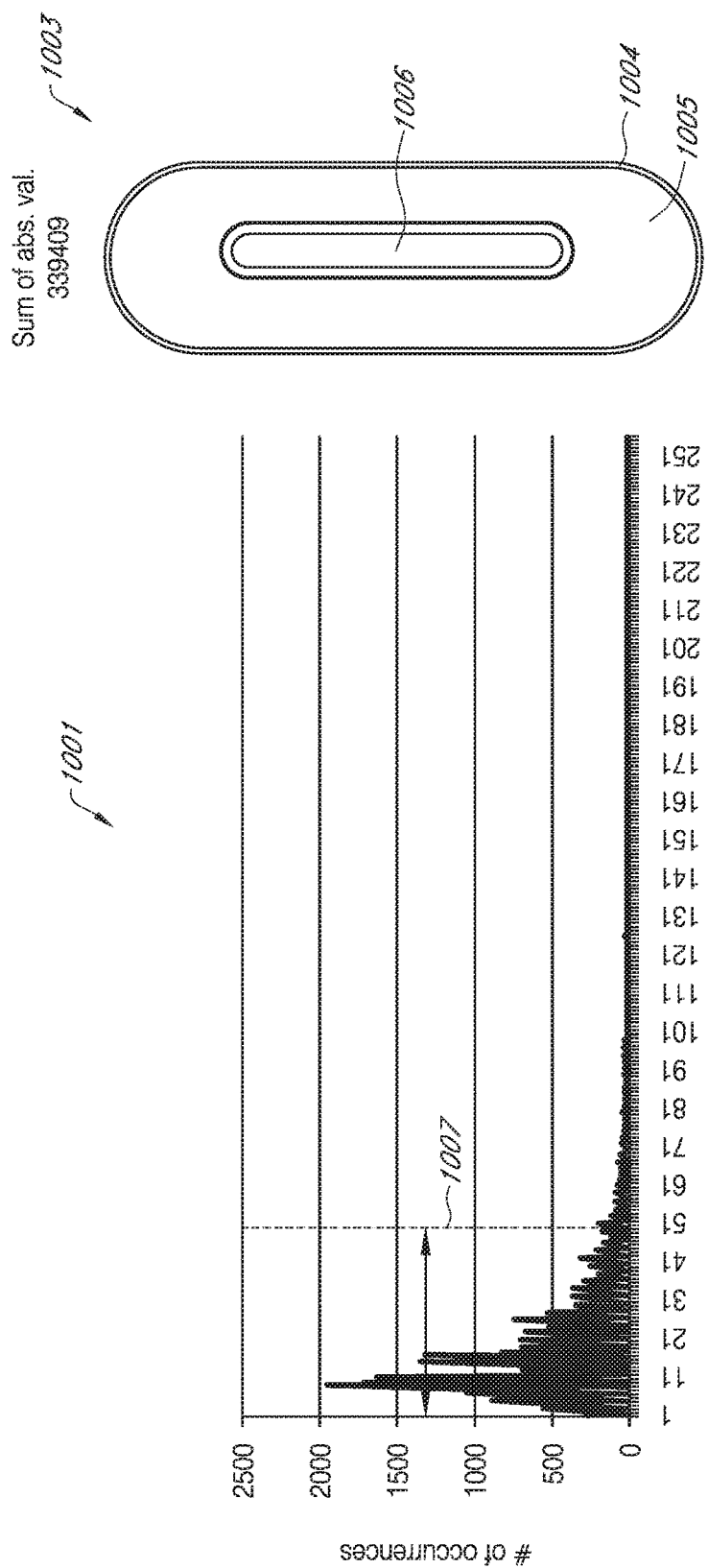
FIG. 10 illustrates a histogram of gradient intensities, corresponding to a representation of a deposited layer within a pixel well, seen to the left-side of FIG. 10.

FIGS. 9-10 show respective histograms 901 and 1001 of the absolute values of gradients represented by processed data for two hypothetical pixel wells. Depictions corresponding to the pixel wells are seen at the right-hand side of each FIG., and are respectively numbered 903 and 1003. In the respective FIG., numerals 904 and 1004 shows the position of a pixel confinement bank. Each depiction 903 and 1003 represents gradient values corresponding to PELS representing an image of the associated pixel well, such that 903 and 1003 represent discontinuities in the captured image data associated with the depicted pixel well. FIG. 9 represents data for a deposited layer 905 that has no quality issues, whereas FIG. 10 represents data for a deposited layer 1005 that indeed has quality issues, e.g., a delamination or other defect in the center of the pixel as represented by a "racetrack effect" 1006 appearing in the center of the pixel well. Note again that while the depicted gradients are in this example taken from grayscale intensity values, in practice, a gradient can be applied to many other types of data representing or derived from a captured image.

Referring to the histogram 901 of FIG. 9, as indicated by the FIG., the "y-axis" of the histogram represents the number of occurrences of a given gradient magnitude, whereas the "x-axis" represents gradient magnitude. As seen in the upper-right-hand corner of the FIG., in this example, the sum of the absolute values of the gradients is "164,391," and the pixel well depiction 903 is seen to correspond to a layer deposition with no identifiable quality issues. Note that, as indicated by the histogram, there is no significant number of occurrences of large gradients, and the histogram has a 3σ gradient value of approximately "21." Appropriate values for a quality layer in a pixel well can vary depending on layer type (and resultant image appearance), camera type, magnification, lighting, distance from substrate, whether the layer in question is wet or dried/cured, pixel well size, and many other factors; one or more thresholds by which to assess layer quality are typically empirically determined. In this example, the sum would be compared to a threshold (e.g., "250,000") determined in association with a specific manufacturing process, OLED device and machine (with camera). In one embodiment, a standard is prepared and analyzed in advance using specified equipment, for example, using a prepared substrate with good and bad pixel fills (i.e., with layer defects), or by dynamically printing such a standard with a deliberately-injected pixel defect (i.e., into a reference well) to assess these thresholds. Note also that as referenced earlier, in one embodiment, multiple quality tests are applied; this is to say, the gradient sum shown in the upper-right-hand corner of FIG. 9 could theoretically result from a predominance of a relatively small number of very large gradients or a large number of small gradients (the latter in fact being represented by the histogram 901 of FIG. 9). Thus, in one embodiment, a statistical measure, in this case, 3σ analysis, is also applied to distinguish these cases; as indicated, the 3σ level in the case of FIG. 9 falls at approximately "21," which indicates that approximately 99% of layer material in the pixel well under analysis produced a gradient value of less than or equal to "21," a relatively small value. As the standard deviation (σ) is dependent on the square of the gradient values and the number of PELs represented by the histogram, this value would have been expected to be larger if the gradient sum (164,391) were produced by a greater incidence of large magnitude gradients. Thus, in this case, the 3σ level represented by the histogram is compared with another threshold (e.g., "40"), and because pixel data for this pixel well satisfies both tests, the layer analyzed within the pixel well is determined to pass threshold quality. Note once again that these various tasks are typically performed by software (instructions on computer-readable media) which control one or more processors to perform these various tasks (including any desired remedial action). Also, as referenced earlier, many other types of criteria and tests can be applied, including without limitation, any type of statistical test, whether based on standard deviation, a 3σ level, variance, sums, sums of squares, absolute values or otherwise. In one embodiment, multiple tests can be applied, for example, classifying quality of a deposited layer by matching gradient values for that layer to one of several ranges of values (distinguished by one or more thresholds).

FIG. 10 illustrates data for a layer that is determined to have quality issues. First, note the "racetrack effect" 1006, visible in the gradient values, representing possible delamination (e.g., of a cured or finished film following post-printing processing steps to finish the film). Given the racetrack effect, it should not be surprising that the depicted histogram 1003 shows a much more frequent occurrence of large gradient values (e.g., representing gradient magnitudes of 30-70), corresponding to the "racetrack" shapes shown within depiction 1003. That is, as noted at the right side of FIG. 10, the sum of (absolute) gradient values in this case (339,409) is significantly larger than the hypothetical threshold of "250,000." Applying the test references above for FIG. 9, a comparison of these values would indicate that the layer in question might have quality issues, and again, remedial measures can optionally be applied. Note also that the 3σ level in this case, represented by line 1007, is just over "50," exceeding the hypothetical threshold of "40" used above in connection with FIG. 9.

Figure 11:
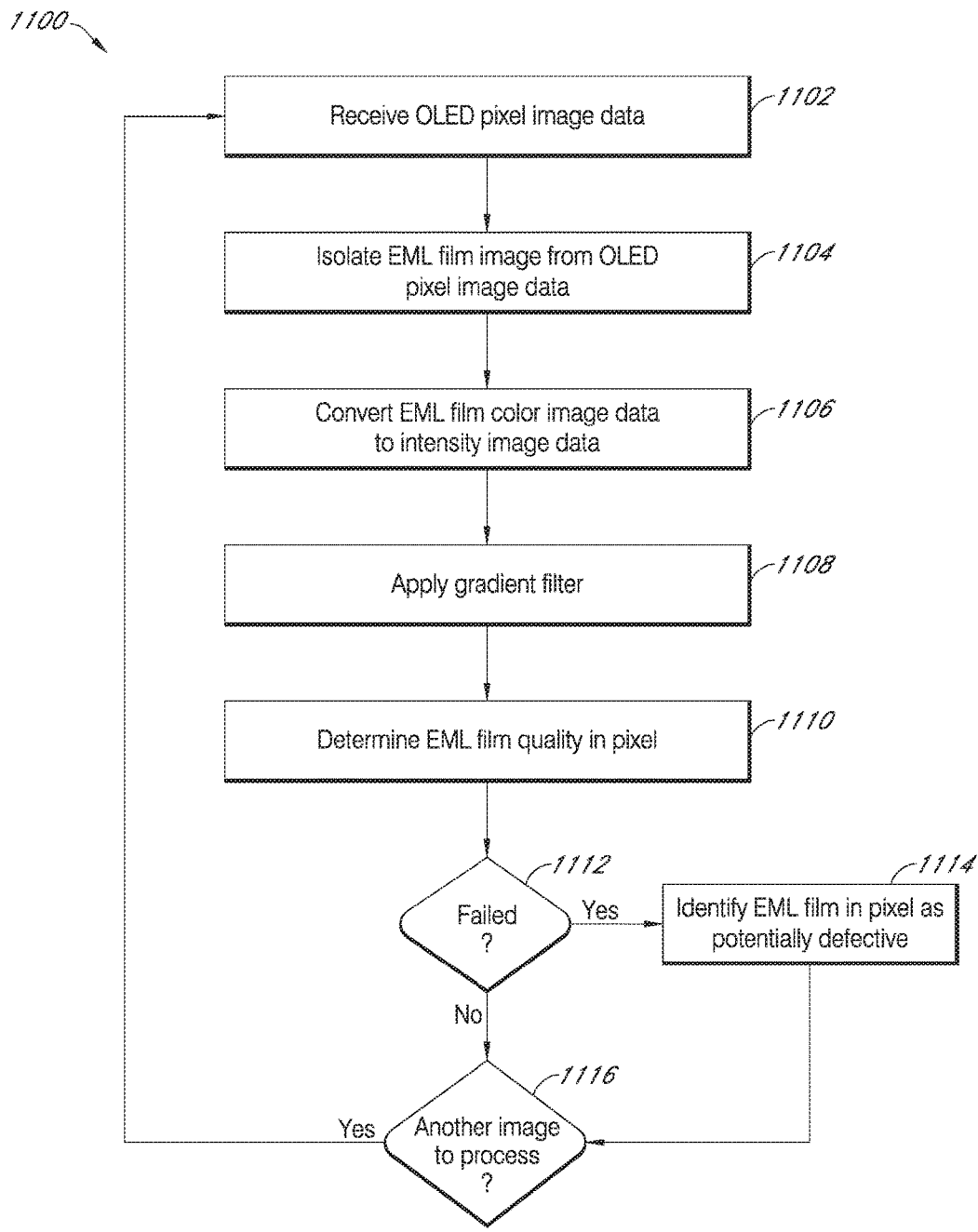
FIG. 11 depicts a flow diagram illustrating example operations performed by an image processing application of a data collection apparatus in accordance with various embodiments of the present teachings.

FIG. 11 shows another embodiment (1100) of a method for processing image data. Additional, fewer, or different operations can be performed depending on the implementation. For example, method 1100 of FIG. 11 can provide additional functionality beyond the capability to process one or more images. The order of presentation of the operations of method 1100 of FIG. 11 is not intended to be limiting. Thus, although some of the operational flows are presented in sequence, the various operations can be performed in various repetitions, concurrently, and in other orders than those that are illustrated. Various implementations of the method 1100 of FIG. 11 can be in the form of an image processing or printer control application having computer-readable instructions that, when executed by one or more processors, cause the processor(s) to perform various functions depicted in FIG. 11 for analyzing image data representing a pixel well.

Per operation 1102, captured image data is received, for example, from memory, from a camera or from another destination. In a first example, a single image can be received at a time, and in another implementation, multiple images can be received, e.g., in connection with massively-parallel image processing used to provide for very-fast analysis of the OLED stack films in millions of pixel wells that comprise a flat panel display. Accordingly, the captured image data received in operation 1102 encompasses at least one pixel well containing an OLED stack film. If the captured image data encompasses multiple, complete pixel wells, then each can be analyzed from a common image, either sequentially, or in parallel. If respective pixel wells have different layer materials that are to be analyzed, for example, light emissive layers for light of different colors, then analysis of image data for these wells can use respective processes, threads, thresholds or other particulars suitable to the layer under analysis. In one embodiment, image data representing a stream of images can be processed in real time, with image processing software tracking well position and identifying (in software) which wells have already been processed amongst the captured images and which wells have not (and respective locations of these wells). The image data can be captured as part of the printing process of an OLED device substrate or as part of a subsequent quality assurance process. The data also can be simultaneously displayed on a display of a data collection apparatus or of an imaging processing device, or otherwise printed for human-visual inspection.

As another option, the image data can be stored in database of computing device, read from a database under control of an automated image processing application of method 1100, and thereby received by the image processing application for processing. A user can optionally select the image data for reading, for example, using a user interface presented under control of an image processing application of method 1100. As understood by a person of skill in the art, the image data captured of portions of a flat panel display substrate can be stored in a variety of formats. In an illustrative embodiment, the image files can be stored as unprocessed RGB color pixel data.

In operation 1104, filtered image data representing an OLED stack under analysis can be isolated from a captured image that encompasses superfluous data (i.e., outside of a pixel well). Numerous different algorithms can be used for this purpose (i.e., extracting data corresponding to an OLED film or stack from a captured image. As alluded to previously, in one embodiment, a gradient filter (i.e., a second gradient operator) can be used to identify periphery of a layer under analysis and, in so doing, extract data just corresponding to the deposited layer. It is also possible simply to use a template corresponding to pixel well geography, and to use that template to mask the image under analysis. In yet another embodiment, operation 1104 is combined with the image capture step (i.e., such that image data is captured only for the layer in question, or is otherwise filtered at the camera or prior to receipt by the image processing system to reduce the amount of superfluous data).

In operation 1106, filtered data, for example, representing an emissive material layer ("EML") of an OLED stack can be converted to a format that emphasizes a particular image characteristic. In this case, color image data representing the deposited layer is converted to grayscale intensity data according to the well-known formula/(Grayscale) =Red*0.3+Green*0.59+Blue*0.11. In various formula referenced below, the grayscale intensity values will be generally represented as $G_{xy}$, where x and y refer to PEL position within the captured image. Note that this type of emphasis is purely optional, i.e., it is possible to perform gradient analysis on color image data directly, and it is also possible to capture monochromatic image data; clearly, other alternatives also exist.

Regarding operation 1108, the filtered data representing a pixel well (emphasized or otherwise) is then convolved with a gradient filter to generate processed data representing gradients within the deposited layer. In one embodiment, the gradient filter is expressed as a relative simple matrix and the convolution is applied using a window within PELs of the filtered image data; this is expressed mathematically as:

$$\begin{bmatrix} G_{11} & G_{12} & G_{13} \\ G_{21} & G_{22} & G_{23} \\ G_{31} & G_{32} & G_{33} \end{bmatrix} \Theta \begin{bmatrix} F_1 & F_2 \end{bmatrix} =$$

$$\begin{bmatrix} (G_{11}*F_1 + G_{12}*F_2) & (G_{12}*F_1 + G_{13}*F_2) \\ (G_{21}*F_1 + G_{22}*F_2) & (G_{22}*F_1 + G_{23}*F_2) \\ (G_{31}*F_1 + G_{32}*F_2) & (G_{23}*F_1 + G_{33}*F_2) \end{bmatrix}$$

where:

G represents the grayscale intensity value of a PEL;
$\Theta$ is the convolution operator;
$[F_1\ F_2]$ is gradient filter mask; and
the matrix on the right is the resultant processed data The depicted convolution operation produces gradient values that emphasize vertical line differences between horizontally-adjacent PELs of captured image data representing the layer under scrutiny. A perfectly uniform layer would have a filtered image matrix of all zeros. In this regard, a sum of the absolute values of all the gradient values represented by the processed data can present a criterion for evaluating the uniformity of the layer under scrutiny, and hence the OLED stack.

Regarding the selection of a gradient filter mask, there are many different types of masks that can be used. Gradient filters are distinguishable based on the mask applied. The exemplary mask indicated above presents a dual symmetry along a horizontal axis. Other types of gradient filters can also be used. For example, in a Sobel mask, a horizontal axis divides the top and bottom into identical [1, 0,-1] while a vertical axis divides the mask into [1, 2, 1] and [-1,-2,-1]. Some exemplary gradient filter masks that can be used are shown in the table below:

| | | |
|---|---|---|
| Sobel Masks | $\begin{bmatrix} 1 & 0 & -1 \\ 2 & 0 & -2 \\ 1 & 0 & -1 \end{bmatrix}$ | $\begin{bmatrix} 1 & 2 & 1 \\ 0 & 0 & 0 \\ -1 & -2 & -1 \end{bmatrix}$ |
| Prewitt Masks | $\begin{bmatrix} 1 & 0 & -1 \\ 1 & 0 & -1 \\ 1 & 0 & -1 \end{bmatrix}$ | $\begin{bmatrix} 1 & 1 & 1 \\ 0 & 0 & 0 \\ -1 & -1 & -1 \end{bmatrix}$ |
| Kirsh Masks | $\begin{bmatrix} 5 & -3 & -3 \\ 5 & 0 & -3 \\ 5 & -3 & -3 \end{bmatrix}$ | $\begin{bmatrix} 5 & 5 & 5 \\ -3 & 0 & -3 \\ -3 & -3 & -3 \end{bmatrix}$ |

Note that these gradient filters emphasize both vertical and horizontal discontinuities in the imaged layer.

In operation 1110, the method proceeds to analyze quality of the deposited film under scrutiny. Once again, the method can be entirely automated, e.g., under the control of software. Summing the absolute values of the brightness differences can create a score for the evaluation of uniformity of a layer within a given pixel well, and therefore quality of the deposited OLED stack within a given pixel well. In this example, a very low gradient sum correlates to a uniform, delamination-free pixel.

However, as previously alluded to, a gradient sum score alone may not be dispositive on the issue of film quality. For example, a film layer having a large discontinuity in the film center, while being otherwise uniform could have an equal gradient sum to a layer having uniformly small gradients distributed throughout the film.

Therefore, in one embodiment, a statistical measure such as a variance, standard deviation, histogram, or other measure of matrix elements is computed and used to effectively distinguish a film layer having an image containing significant intensity changes, which can indicate a defective film, from a film that contains fairly uniform small intensity changes, which can indicate a satisfactory film.

By evaluating both the gradient or processed data (e.g., the sum of the processed gradient values) and data representing the distribution of gradients values throughout the pixel well, the quality of an OLED stack film can be determined. In various embodiments, the data generated from the filtered intensity data, can be compared to thresholds. Factors that can impact the quality of an OLED stack film image, such as different lighting, different positioning of a camera, and different substrate construction and inks used to form the pixel can once again have an effect on what constitutes a good gradient sum and good histogram characteristics. Accordingly, calibration using a standard can be used to define good gradient sum and statistical characteristics under a specified set of conditions, and a threshold gradient sum and a threshold statistical reference can be determined by using images of film layers of defined uniformity. Using simple statistical quality control, a mean and standard deviation for acceptable pixel images can be determined. Depending on the level of quality desired, a failure threshold (or set of thresholds) can be set a corresponding number of standard deviations beyond the mean identified for good pixel values.

In operation 1112, a determination can be made concerning whether or not a layer in the pixel well at an identified pixel cell location is defective in some manner. For example, the determination can be made if the sum and variance do not satisfy the thresholds defined for a satisfactory layer. If the determination can be that the layer is defective in some manner, processing continues in operation 1114. If the determination can be that the layer at the identified pixel well location is not defective, processing continues in operation 1116.

In operation 1114, a layer within a pixel well can be identified as at least potentially defective. For example, the particular pixel cell and/or well can be flagged for visual inspection by an inspector to confirm the determination. A notification to an inspector or operator can be provided to the inspector using a speaker, a printer, a display or by preparing and sending a message via text, email, or voicemail, or by saving information related to the determination in a database for subsequent review. Other forms of remedial measure are also possible, as discussed previously. In one embodiment, a result that a quality issue exists affects subsequent processing, for example, interrupting further image consideration and/or subsequent OLED device fabrication processes. In another embodiment, processing continues via operation 1116, with an inspector or operator being notified of the existence of any potential defect, with such potential defect addressed at a later point in time.

In operation 1116, a determination can be made concerning whether or not there is more image data to process. If the determination can be that there is more image data to process, processing continues in operation 1100. If the determination can be that there is no more image data to process, the method 1100 can cease. Statistics can be calculated relative to the number of defective pixels identified for the entirety of the OLED device to determine whether processing should continue or the OLED device should be rejected, or whether other remedial actions should be taken.

Figure 12:
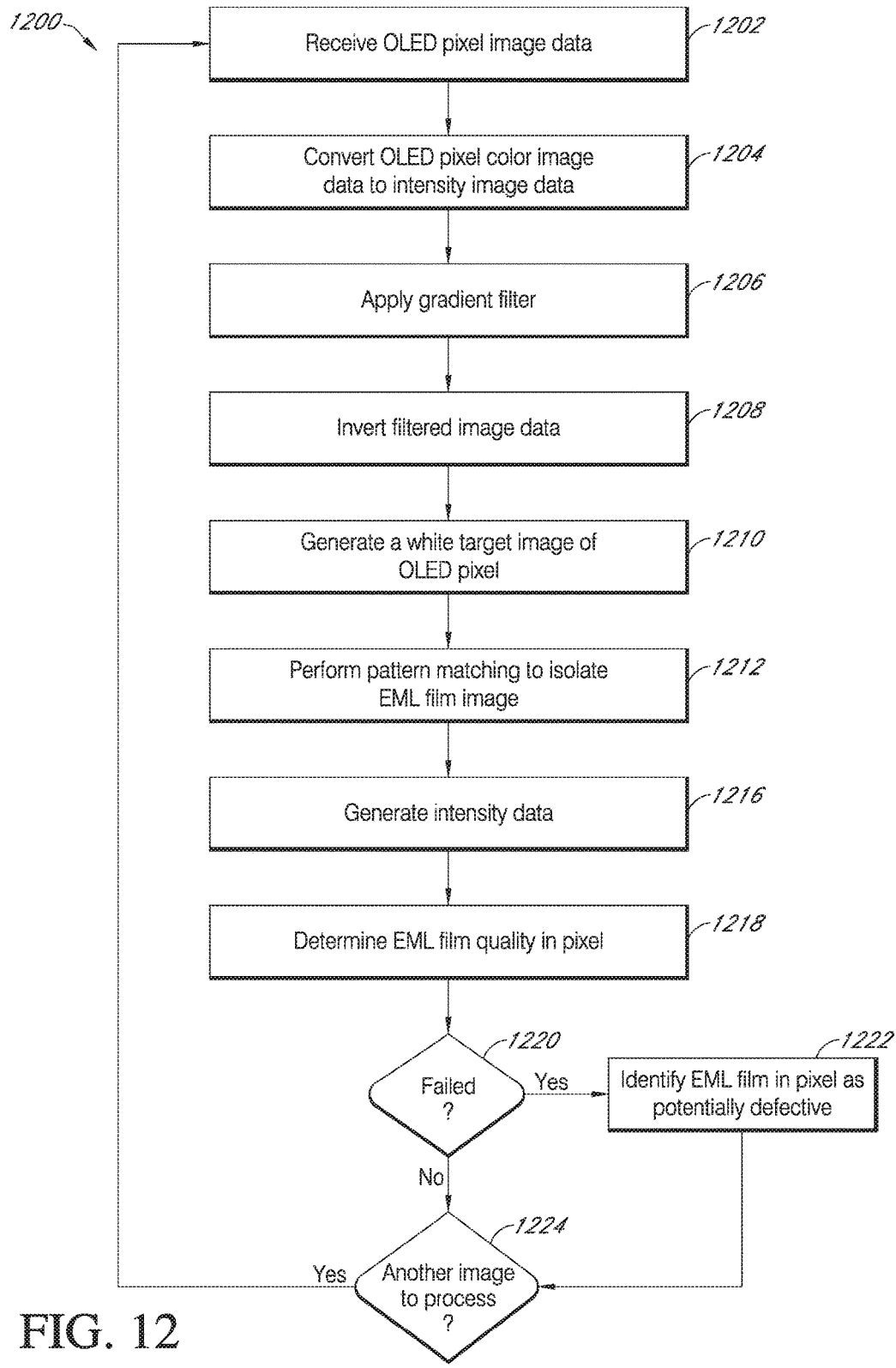
FIG. 12 depicts a flow diagram illustrating example operations performed by an image processing application of a data collection apparatus in accordance with various embodiments of the present teachings.

An alternative embodiment of systems and methods is depicted in the flow diagram shown in FIG. 12. In method 1200, the steps of isolating (filtering) image data for a film layer to focus on just layer information within a pixel well can be performed after steps of converting captured image data to emphasized data, for example, representing grayscale intensity, and applying a gradient function. As before, captured image data is first received, per step 1202. This data is then converted to grayscale intensity data per numeral 1204, to emphasize this selected image characteristic. Per step 1206, a gradient filter is then applied, to emphasize boundaries and edges of a deposited layer, OLED confinement bank, and other features appearing in the captured image data. With respect to steps 1208 and 1210, once the processed (gradient) data has been generated, inverted data can be optionally created, so as to help isolate contours of the interior of a pixel well. As an example, a target image or mask can be created for each pixel well to serve as a mask to mask out gradient values corresponding to superfluous PELs (i.e., representing structures other than the film layer to be analyzed). As an example, following gradient analysis, the pixel well confinement bank can be represented in white (gradient, non-zero value) while other structures including the pixel well are represented in black. This data is then inverted and processed, to assist with forming a mask where values outside of the pixel well are represented as black (zero values), and the interior of the pixel well is represented as white (binary value "1"). This mask can then be applied back to the gradient values so as to isolate gradient values for the layer of interest, per step 1212.

More specifically, a target white image can be created to define a pixel well region, having white values ("1") in areas corresponding to the pixel well and black values ("0") corresponding to other areas of the target image. An inverted version of the processed data (gradient values) can then be converted to binary and combined with the target image according to the equation $\Sigma_{i=1}^{wT}\Sigma_{j=1}^{lT} I_{i+a,j+b} \& T_{ij}$, where l is the inverted gradient matrix and T is the target matrix (mask). This equation essentially positions the mask over the inverted gradient matrix (i.e., the processed data) and produces a maximum result for relative positioning between the two where the mask and pixel well location are exactly aligned. That is, because the operation above applied a Boolean "and" operation, and because the mask has entries that are either white ("1") or black ("0"), the "and" operation will produce a maximum where the two are precisely aligned. The proper position of the mask is ascertained, and then used to mask with the processed (gradient) data in order to isolate gradient values corresponding just to the area of the pixel well.

In the remaining steps 1216-1224, once gradient values for the film layer in question have been isolated, the data is then processed as described earlier, to ascertain layer quality (relative to the existence of defects), and to provide notifications and/or remedial action as previously discussed.

Note that various embodiments of the foregoing exist. For example, the gradient function can be applied at any stage of the process to image data, whether that image data has been filtered or converted or not. Also, while a relatively simple example of a horizontal gradient operation was mentioned in connection with the equations above, more complex gradient functions can be applied, for example, that do not rely on matrix math, that compute vertical gradients, or that compute gradients over PELs other than a nearest neighbor.

In yet another embodiment, image analysis focuses on deposition regions that do not necessarily comprise pixel wells. For example, in a system that deposits a layer of film over a broad region, imaging can be used for one or more discrete target areas making up the region to assess film quality on a parceled basis. Such an implementation generally functions as described above, e.g., with an image being captured for each target area or parcel under analysis, and with a gradient function applied to this image data (or to a derivative thereof, filtered, emphasized or otherwise), to develop processed data. This data can then be analyzed to ascertain the existence of possible defects within the given target area. Other variations also exist.

Methods were described above that can be embodied in a computer-readable medium (e.g., as software or firmware), or otherwise in a machine, for example, a network machine, a printer, a manufacturing system for OLED devices, or in another form.

While the principles of this invention have been described in connection with specific embodiments, it should be understood clearly that these descriptions are made only by way of example and are not intended to limit the scope of the invention. What has been disclosed herein has been provided for the purposes of illustration and description. It is not intended to be exhaustive or to limit what is disclosed to the precise forms described. Many modifications and variations will be apparent to the practitioner skilled in the art. What is disclosed was chosen and described in order to best explain the principles and practical application of the disclosed embodiments of the art described, thereby enabling others skilled in the art to understand the various embodiments and various modifications that are suited to the particular use contemplated. It is intended that the scope of what is disclosed be defined by the following claims and their equivalence.

What is claimed is:

1. A computer-implemented method for monitoring quality of a film deposited on a substrate, wherein the film has been deposited to form a layer respective to each structure of a plurality of structures on the substrate, the layer to have a common size and shape for each of the plurality of structures, the computer-implemented method comprising:
    receiving one or more digital images, wherein the one or more digital images collectively represent each of the plurality of structures;
    for each given structure of the plurality of structures
        processing image data from the one or more digital images to identify gradients derived from image data which correspond to the common size and shape and which satisfy a first threshold, and
        identifying a quality defect if gradients which are greater than the first threshold collectively satisfy a second threshold; and
    identifying that the film is not defective for a product represented by the plurality of structures dependent on performing the processing of the gradients and the identifying the quality defect for each of the plurality of structures.

2. The computer-implemented method of claim 1, wherein:
    the first threshold is a non-zero threshold; and
    processing the image data comprises filtering the image data to obtain filtered image data representing only an expected footprint of the film corresponding to the given structure, applying an operator to the filtered image data which emphasizes intensity variation to obtain the gradients, and comparing an absolute value of a magnitude of each gradient with the first threshold, such that the gradients which satisfy the first threshold represent at least a predetermined amount of intensity variation in the image data.

3. The computer-implemented method of claim 2, wherein the operator is a Sobel operator.

4. The computer-implemented method of claim 1, wherein:
    processing the image data comprises filtering the image data to obtain filtered image data representing only an expected footprint of the film corresponding to the given structure; and
    identifying the quality defect comprises
        identifying a number of the gradients which are greater than the first threshold, if any,
        processing the number of gradients which are greater than the first threshold to obtain a result, and
        determining whether the result satisfies the second threshold.

5. The computer-implemented method of claim 1, wherein each structure is an electro-optical element of the product, and wherein the plurality of structures comprises at least one thousand of the electro-optical elements.

6. The computer-implemented method of claim 5, wherein the product is a display device, and wherein the computer-implemented method further comprises taking a remedial measure if the quality defect is identified for at least a predetermined number of the electro-optical elements.

7. The computer-implemented method of claim 5, wherein the layer is a first layer and wherein the computer-implemented method further comprises causing one or more ensuing layers to be fabricated on top of the first layer and the substrate for each structure of the plurality of structures, to finish the product, if the film is determined to not be defective.

8. The computer-implemented method of claim 1, wherein the film deposited on the substrate is a wet, organic material.

9. The computer-implemented method of claim 1, wherein processing the image data comprises:
    filtering image data to identify the layer for the given structure;
    creating a mask from the filtered image data; and
    applying the mask to the image data so as to eliminate image data not representing the layer, and processing the remaining image data.

10. The computer-implemented method of claim 1, wherein the computer-implemented method further comprises:
    causing a printer to print the film as a wet ink; and
    in response to identifying that the film is not defective, causing a processing device to perform at least one of cure or dry of the film.

11. The computer-implemented method of claim 1, wherein receiving the one or more digital images comprises causing a high-resolution camera to take a picture of at least part of the substrate, receiving the image data from the high-resolution camera, and storing the image data in digital memory.

12. A fabrication method for fabricating a product, comprising:
    printing an ink on a substrate to deposit a film, the film to form a layer respective to each structure of a plurality of structures on the substrate, the layer to have a common size and shape for each of the plurality of structures;
    performing a computer-implemented method for monitoring quality of the film, comprising
        receiving one or more digital images, wherein the one or more digital images collectively represent each of the plurality of structures,
        for each given structure of the plurality of structures
            processing image data from the one or more digital images to identify gradients derived from image data which correspond to the common size and shape and which satisfy a first threshold, and
            identifying a quality defect if gradients which are greater than the first threshold collectively satisfy a second threshold, and
        identifying that the film is not defective for a product represented by the plurality of structures dependent on performing the processing of the gradients and the identifying the quality defect for each of the plurality of structures; and in response to identifying that the film is not defective, causing a processing device to perform at least one of cure or dry of the film.

13. The fabrication method of claim 12, wherein:
the first threshold is a non-zero threshold; and
processing the image data comprises filtering the image data to obtain filtered image data representing only an expected footprint of the film corresponding to the given structure, applying an operator to the filtered image data which emphasizes intensity variation to obtain the gradients, and comparing an absolute value of a magnitude of each gradient with the first threshold, such that the gradients which satisfy the first threshold represent at least a predetermined amount of intensity variation in the image data.

14. The fabrication method of claim 13, wherein the operator is a Sobel operator.

15. The fabrication method of claim 12, wherein:
processing the image data comprises filtering the image data to obtain filtered image data representing only an expected footprint of the film corresponding to the given structure; and
identifying the quality defect comprises
identifying a number of the gradients which are greater than the first threshold, if any,
processing the number of gradients which are greater than the first threshold to obtain a result, and
determining whether the result satisfies the second threshold.

16. The fabrication method of claim 12, wherein each structure is an electro-optical element of the product, and wherein the plurality of structures comprises at least one thousand of the electro-optical elements.

17. The fabrication method of claim 16, wherein the product is a display device, and wherein the fabrication method further comprises taking a remedial measure if the quality defect is identified for at least a predetermined number of the electro-optical elements.

18. The fabrication method of claim 16, wherein the layer is a first layer and wherein the fabrication method further comprises causing one or more ensuing layers to be fabricated on top of the first layer and the substrate for each structure of the plurality of structures, to finish the product, if the film is determined to not be defective.

19. The fabrication method of claim 12, wherein processing the image data comprises:
filtering image data to identify the layer for the given structure;
creating a mask from the filtered image data; and
applying the mask to the image data so as to eliminate image data not representing the layer, and processing the remaining image data.

20. The fabrication method of claim 12, wherein receiving the one or more digital images comprises causing a high-resolution camera to take a picture of at least part of the substrate, receiving the image data from the high-resolution camera, and storing the image data in digital memory.

21. A computer-implemented method for monitoring quality of a film deposited on a substrate, wherein the film has been deposited to form a layer respective to each structure of a plurality of structures on the substrate, the layer to have a common size and shape for each of the plurality of structures, the computer-implemented method comprising:
receiving one or more digital images, wherein receiving comprises causing a high-resolution camera to take a picture of at least part of the substrate, receiving the one or more digital images from the high-resolution camera, and storing associated image data in digital memory, wherein the one or more digital images collectively represent each of the plurality of structures;
for each given structure of the plurality of structures
processing the image data to identify gradients derived from image data which correspond to the common size and shape and which satisfy a first threshold, and identifying a quality defect, if any, if gradients which are greater than the first threshold collectively satisfy a second threshold;
identifying that the film is not defective for a product represented by the plurality of structures dependent on performing the processing of the gradients and the identifying the quality defect for each of the plurality of structures; and
repeating the receiving, processing, identifying the quality defect, if any, and identifying that the film is not defective, for each of respective substrates.

* * * * *